(12) United States Patent
Oh et al.

(10) Patent No.: US 11,996,402 B2
(45) Date of Patent: May 28, 2024

(54) SEMICONDUCTOR DEVICE

(71) Applicant: Samsung Electronics Co., Ltd., Suwon-si (KR)

(72) Inventors: In-Wook Oh, Suwon-si (KR); Byungyun Kang, Anyang-si (KR); Donghyun Kim, Hwaseong-si (KR); Hyungjune Kim, Suwon-si (KR); Jaebong Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 440 days.

(21) Appl. No.: 17/329,669

(22) Filed: May 25, 2021

(65) Prior Publication Data

US 2022/0139900 A1   May 5, 2022

(30) Foreign Application Priority Data

Nov. 2, 2020   (KR) .................. 10-2020-0144216

(51) Int. Cl.
*H01L 27/02*   (2006.01)
*H01L 21/8238*   (2006.01)
(Continued)

(52) U.S. Cl.
CPC .. *H01L 27/0207* (2013.01); *H01L 21/823814* (2013.01); *H01L 21/823821* (2013.01);
(Continued)

(58) Field of Classification Search
CPC ......... H01L 27/0207; H01L 21/823814; H01L 21/823821; H01L 21/823871; H01L 23/481; H01L 23/5286; H01L 27/092; H01L 29/0665; H01L 29/0847; H01L 29/42392; H01L 29/7851; H01L 29/78618; H01L 29/78696; H01L 23/485; H01L 21/76898; H01L 27/0924; H01L 29/0673; H01L 29/7827; H01L 29/41766;
(Continued)

(56) References Cited

U.S. PATENT DOCUMENTS 8,174,124 B2   5/2012   Chiu et al.
9,905,535 B2   2/2018   Lee
(Continued)

FOREIGN PATENT DOCUMENTS

JP   2010-232669 A   10/2010
JP   5568467 B2   8/2014
(Continued)

*Primary Examiner* — David Vu
(74) *Attorney, Agent, or Firm* — Harness, Dickey & Pierce, P.L.C.

(57) ABSTRACT

Disclosed is a semiconductor device comprising a substrate that includes a cell region and a dummy region, a first metal layer on the substrate and including a dummy line on the dummy region, a power delivery network on a bottom surface of the substrate, and a first through via that penetrates the substrate and extends from the power delivery network toward the dummy line. The first through via is electrically connected to the dummy line. The power delivery network includes a plurality of lower lines and a pad line below the lower lines. The pad line is electrically connected through the lower lines to the first through via.

20 Claims, 22 Drawing Sheets

(51) Int. Cl.
   *H01L 23/48*      (2006.01)
   *H01L 23/528*     (2006.01)
   *H01L 27/092*     (2006.01)
   *H01L 29/06*      (2006.01)
   *H01L 29/08*      (2006.01)
   *H01L 29/423*     (2006.01)
   *H01L 29/78*      (2006.01)
   *H01L 29/786*     (2006.01)

(52) U.S. Cl.
   CPC .... *H01L 21/823871* (2013.01); *H01L 23/481* (2013.01); *H01L 23/5286* (2013.01); *H01L 27/092* (2013.01); *H01L 29/0665* (2013.01); *H01L 29/0847* (2013.01); *H01L 29/42392* (2013.01); *H01L 29/7851* (2013.01); *H01L 29/78618* (2013.01); *H01L 29/78696* (2013.01)

(58) Field of Classification Search
   CPC ............. H01L 29/42376; H01L 29/456; H01L 29/7848; H01L 29/775; H01L 23/528; H01L 23/49827; H01L 23/49838; H01L 23/525; H01L 24/06; H01L 24/09; H01L 27/088
   See application file for complete search history.

(56) References Cited

U.S. PATENT DOCUMENTS

| | | | |
|---|---|---|---|
| 10,622,300 B2* | 4/2020 | Tu | ........................ H01L 23/528 |
| 2010/0225005 A1 | 9/2010 | Nishio et al. | |
| 2013/0313718 A1 | 11/2013 | Varghese et al. | |
| 2013/0320504 A1 | 12/2013 | Lee et al. | |

FOREIGN PATENT DOCUMENTS

| | | |
|---|---|---|
| JP | 2015-076430 A | 4/2015 |
| JP | 2016-004860 A | 1/2016 |

* cited by examiner

SEMICONDUCTOR DEVICE

CROSS-REFERENCE TO RELATED APPLICATION

This U.S. nonprovisional application claims priority under 35 U.S.C § 119 to Korean Patent Application No. 10-2020-0144216 filed on Nov. 2, 2020 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor.

Semiconductor devices are beneficial in the electronic industry because of their small size, multi-functionality, and/or low fabrication cost. Semiconductor devices may encompass semiconductor memory devices storing logic data, semiconductor logic devices processing operations of logic data, and hybrid semiconductor devices having both memory and logic elements. Semiconductor devices have been increasingly required for high integration with the advanced development of the electronic industry. For example, semiconductor devices have been increasingly requested for high reliability, high speed, and/or multi-functionality. Semiconductor devices are gradually complicated and integrated to meet these requested characteristics.

SUMMARY

Some example embodiments of the present inventive concepts provide a semiconductor device with improved electrical characteristics.

According to some example embodiments of the present inventive concepts, a semiconductor device may comprise: a substrate that includes a cell region and a dummy region; a first metal layer on the substrate, the first metal layer including a dummy line on the dummy region; a power delivery network on a bottom surface of the substrate; and a first through via that penetrates the substrate and extends from the power delivery network toward the dummy line. The first through via may be electrically connected to the dummy line. The power delivery network may include: a plurality of lower lines; and a pad line below the lower lines. The pad line may be electrically connected through the lower lines to the first through via.

According to some example embodiments of the present inventive concepts, a semiconductor device may comprise: a substrate; a first metal layer on the substrate; a power delivery network on a bottom surface of the substrate; and a first through via and a second through via that penetrate the substrate and extend from the power delivery network toward the first metal layer. The power delivery network may include: a first lower line electrically connected to the first through via; a second lower line electrically connected to the second through via; and a pad line electrically connected to the first lower line. The second through via and the second lower line may be configured to be electrically floated.

According to some example embodiments of the present inventive concepts, a semiconductor device may comprise: a substrate that includes a cell region and a dummy region; a first metal layer on the substrate; a second metal layer on the first metal layer; and a power delivery network on a bottom surface of the substrate. The cell region may include: a first active region and a second active region; a first active pattern and a second active pattern on the first active region and the second active region, respectively; a first source/drain pattern and a second source/drain pattern on upper portions of the first active pattern and the second active pattern, respectively; a gate electrode extending in a first direction and running across the first and second active patterns; an active contact adjacent to one side of the gate electrode and coupled to one of the first and second source/drain patterns; a gate contact coupled to the gate electrode; and a first through via that penetrates the substrate and extends from the power delivery network toward a power line of the first metal layer. The dummy region may include a second through via that penetrates the substrate and extends from the power delivery network toward a dummy line of the first metal layer. The power delivery network may include: a first lower line electrically connected to the first through via; a second lower line electrically connected to the second through via; a pad line electrically connected to the second lower line; and an external connection member on the pad line.

DETAILED DESCRIPTION

Figure 1:
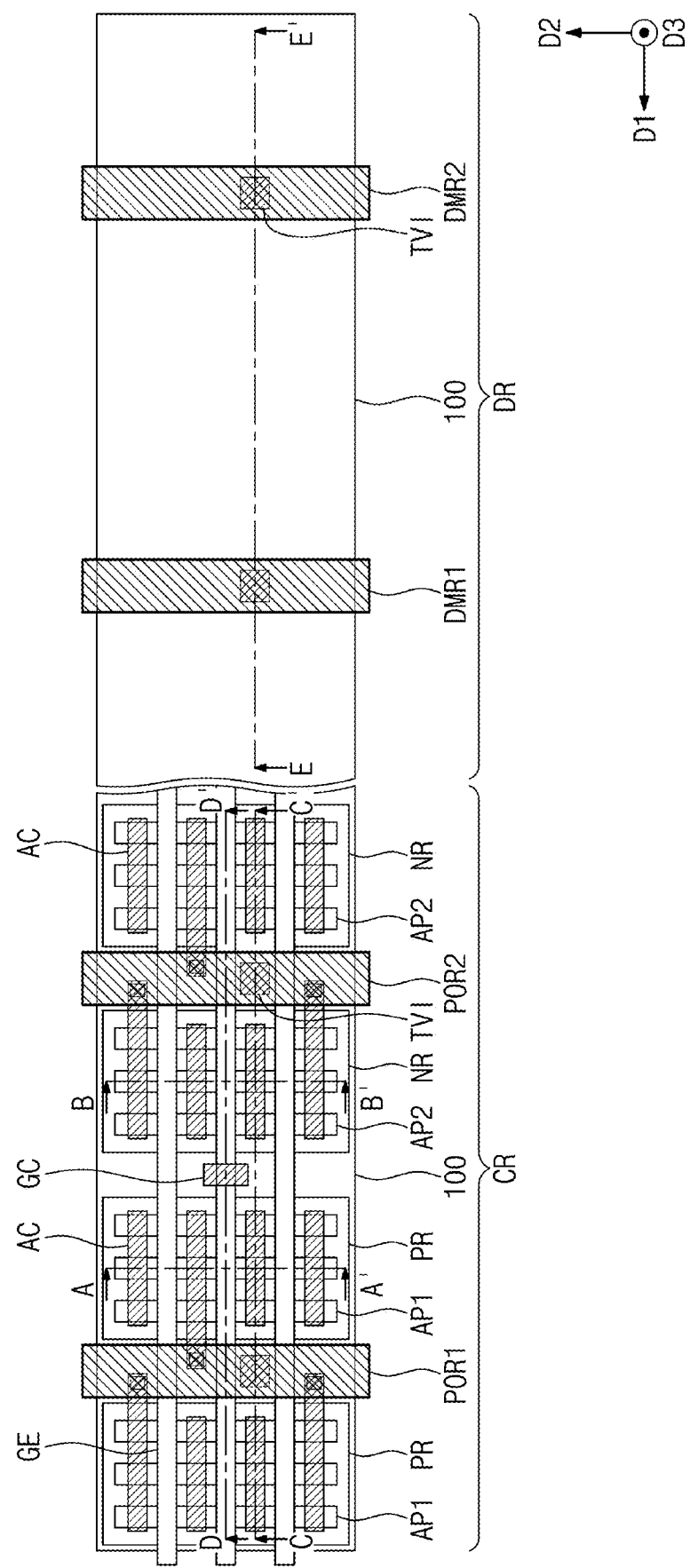
FIG. 1 illustrates a plan view showing a semiconductor device according to some example embodiments of the present inventive concepts.

FIG. 1 illustrates a plan view showing a semiconductor device according to some example embodiments of the present inventive concepts. FIGS. 2A, 2B, 2C, 2D, and 2E illustrate cross-sectional views respectively taken along lines A-A', B-B', C-C', D-D', and E-E' of FIG. 1.

Referring to FIGS. 1 and 2A-2D, a substrate 100 may be provided which has at least one cell region CR. The substrate 100 may further include a dummy region DR. For example, the cell region CR may include logic cells. In this description, the logic cell may mean a logic device, such as AND, OR, XOR, XNOR, inverter, etc., that performs a specific function. For example, the logic cell may include transistors for constituting a logic device and wiring lines that connect the transistors to each other. The dummy region DR may include no transistor. The following will describe in detail the cell region CR with reference to FIGS. 1 and 2A to 2D.

The substrate 100 may include a first active region PR and/or a second active region NR. The first active region PR may be a PMOSFET area, and the second active region NR may be an NMOSFET area. The substrate 100 may be a compound semiconductor substrate or a semiconductor substrate including silicon, germanium, and/or silicon-germanium. For example, the substrate 100 may be a silicon substrate.

The first active region PR and the second active region NR may be defined by a second trench TR2 formed on an upper portion of the substrate 100. The second trench TR2 may be positioned between the first active region PR and the second active region NR. The second trench TR2 may be placed between neighboring first active regions PR and between neighboring second active regions NR. The first active region PR and the second active region NR may be spaced apart from each other in a first direction D1 across the second trench TR2. Each, or at least one, of the first and second active regions PR and NR may extend in a second direction D2 that intersects the first direction D1.

First active patterns AP1 and second active patterns AP2 may be respectively provided on the first active region PR and the second active region NR. The first and second active patterns AP1 and AP2 may extend parallel to each other in the second direction D2. The first and second active patterns AP1 and AP2 may be vertically protruding portions of the substrate 100. A first trench TR1 may be defined between neighboring first active patterns AP1 and between neighboring second active patterns AP2. The first trench TR1 may be shallower than the second trench TR2.

A device isolation layer ST may fill the first and/or second trenches TR1 and TR2. The device isolation layer ST may include a silicon oxide layer. The first and/or second active patterns AP1 and AP2 may have upper portions that protrude upwards vertically from the device isolation layer ST (see FIG. 2D). Each, or at least one, of the first and second active patterns AP1 and AP2 may have a fin shape at the upper portion thereof. The device isolation layer ST may cover none of the upper portions of the first and/or second active patterns AP1 and AP2. The device isolation layer ST may cover lower sidewalls of the first and/or second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2.

The first and/or second source/drain patterns SD1 and SD2 may be epitaxial patterns formed by a selective epitaxial growth process. For example, the first and/or second source/drain patterns SD1 and SD2 may have their top surfaces coplanar with those of the first and/or second channel patterns CH1 and CH2. For another example, the first and/or second source/drain patterns SD1 and SD2 may have their top surfaces higher than those of the first and/or second channel patterns CH1 and CH2.

The first source/drain patterns SD1 may include a semiconductor element (e.g., SiGe) whose lattice constant is greater than that of a semiconductor element of the substrate 100. Therefore, the first source/drain patterns SD1 may provide the first channel patterns CH1 with compressive stress. For example, the second source/drain patterns SD2 may include the same semiconductor element (e.g., Si) as that of the substrate 100.

Gate electrodes GE may be provided to extend in the first direction D1, while running across the first and/or second active patterns AP1 and AP2. The gate electrodes GE may be arranged at a first pitch along the second direction D2. The gate electrodes GE may vertically overlap the first and/or second channel patterns CH1 and CH2. The gate electrode GE may surround a top surface and opposite sidewalls of each of the first and/or second channel patterns CH1 and CH2.

Referring back to FIG. 2D, the gate electrode GE may be provided on a first top surface TS1 of the first channel pattern CH1 and/or at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor according to some example embodiments may be a three-dimensional field effect transistor (e.g., FinFET) in which the gate electrode GE three-dimensionally surrounds the first and/or second channel patterns CH1 and CH2.

Referring back to FIGS. 1 and 2A to 2D, a pair of gate spacers GS may be disposed on opposite sidewalls of each, or at least one, of the gate electrodes GE. The gate spacers GS may extend in the first direction D1 along the gate electrode GE. The gate spacer GS may have a top surface higher than that of the gate electrode GE. The top surface of the gate spacer GS may be coplanar with that of a first interlayer dielectric layer 110 which will be discussed below. The gate spacer GS may include at least one selected from SiCN, SiCON, and/or SiN. Alternatively, the gate spacer GS may include a multi-layer formed of at least two selected from SiCN, SiCON, and/or SiN.

A gate capping pattern GP may be provided on each, or at least one, of the gate electrodes GE. The gate capping pattern GP may extend in the first direction D1 along the gate electrode GE. The gate capping pattern GP may include a material having an etch selectivity with respect to first and/or second interlayer dielectric layers 110 and 120 which will be discussed below. For example, the gate capping pattern GP may include at least one selected from SiON, SiCN, SiCON, and/or SiN.

A gate dielectric pattern GI may be interposed between the gate electrode GE and the first active pattern AP1 and/or between the gate electrode GE and the second active pattern AP2. The gate dielectric pattern GI may extend along a bottom surface of the gate electrode GE that overlies the gate dielectric pattern GI. For example, the gate dielectric pattern GI may cover the first top surface TS1 and/or the first sidewall SW1 of the first channel pattern CH1. The gate dielectric pattern GI may cover the second top surface TS2 and/or the second sidewall SW2 of the second channel pattern CH2. The gate dielectric pattern GI may cover a top surface of the device isolation layer ST below the gate electrode GE (see FIG. 2D).

In some example embodiments, the gate dielectric pattern GI may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate electrode GE may include a first metal pattern and a second metal pattern on the first metal pattern. The first metal pattern may be provided on the gate dielectric pattern GI and adjacent to the first and second channel patterns CH1 and CH2. The first metal pattern may include a work-function metal that controls a threshold voltage of a transistor. A thickness and composition of the first metal pattern may be adjusted to achieve a desired threshold voltage.

The first metal pattern may include a metal nitride layer. For example, the first metal pattern may include nitrogen (N) and at least one metal selected from titanium (Ti), tantalum (Ta), aluminum (Al), tungsten (W), and/or molybdenum (Mo). The first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and/or tantalum (Ta).

A first interlayer dielectric layer 110 may be provided on the substrate 100. The first interlayer dielectric layer 110 may cover the gate spacers GS and/or the first and/or second source/drain patterns SD1 and SD2. The first interlayer dielectric layer 110 may have a top surface substantially coplanar with those of the gate capping patterns GP and/or those of the gate spacers GS.

The first interlayer dielectric layer 110 may be provided thereon with a second interlayer dielectric layer 120 that covers the gate capping patterns GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Active contacts AC may be provided to penetrate the first and/or second interlayer dielectric layers 110 and 120 and to have electrical connections with the first and/or second source/drain patterns SD1 and SD2. The active contact AC may have a linear shape that extends in the first direction D1. For example, the active contact AC may be connected to a plurality of first source/drain patterns SD1 and/or a plurality of second source/drain pattern SD2.

The active contact AC may be a self-aligned contact. For example, the gate capping pattern GP and the gate spacer GS may be used to form the active contact AC in a self-aligned manner. For example, the active contact AC may cover at least a portion of a sidewall of the gate spacer GS. Although not shown, the active contact AC may cover a portion of the top surface of the gate capping pattern GP.

A silicide pattern SC may be interposed between the active contact AC and the first source/drain pattern SD1 and/or between the active contact AC and the second source/drain pattern SD2. The active contact AC may be electrically connected through the silicide pattern SC to the first and/or second source/drain patterns SD1 and SD2. The silicide pattern SC may include metal silicide, for example, and/or at least one selected from titanium silicide, tantalum silicide, tungsten silicide, nickel silicide, and/or cobalt silicide.

A gate contact GC may be provided to penetrate the second interlayer dielectric layer 120 and/or the gate capping pattern GP and to have an electrical connection with the gate electrode GE. When viewed in plan, the gate contact GC may be disposed between the first active region PR and the second active region NR. The gate contact GC may vertically overlap the device isolation layer ST that fills the second trench TR2 between the first and second active regions PR and NR.

Each, or at least one, of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and/or cobalt. The barrier pattern BM may cover sidewalls and/or a bottom surface of the conductive pattern FM. The barrier pattern BM may include a metal layer and/or a metal nitride layer. The metal layer may include at least one selected from titanium, tantalum, tungsten, nickel, cobalt, and/or platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

A first metal layer M1 may be provided in the third interlayer dielectric layer 130. On the cell region CR, the first metal layer M1 may include first upper lines UM1, a first power line POR1, and/or a second power line POR2.

The upper lines UM1, the first power line POR1, and/or the second power line POR2 may each extend in the second direction D2, while running across the cell region CR. For example, a power voltage and a ground voltage may be respectively applied to the first power line POR1 and the second power line POR2. The power voltage may be applied through the active contact AC to the first source/drain patterns SD1. The ground voltage may be applied through the active contact AC to the second source/drain patterns SD2. When viewed in plan, the first power line POR1 may be disposed between neighboring first active regions PR, and the second power line POR2 may be disposed between neighboring second active regions NR.

The first metal layer M1 may further include first vias VI1. The first vias VI1 may be correspondingly provided below the first upper lines UM1, the first power line POR1, and/or the second power line POR2. The first via VI1 may be interposed between and electrically connect the active contact AC and the first upper line UM1. The first via VI1 may be interposed between and electrically connect the gate contact GC and the first upper line UM1. The first via VI1 may be interposed between and electrically connect the active contact AC and each, or at least one, of the first and second power lines POR1 and POR2.

For example, a certain line and its underlying first via VI1 of the first metal layer M1 may be formed by individual processes. In more detail, the certain line and its underlying first via VI1 of the first metal layer M1 may each be formed by a single damascene process.

A second metal layer M2 may be provided in the fourth interlayer dielectric layer 140. The second metal layer M2 may include second upper lines UM2. The second upper lines UM2 of the second metal layer M2 may each have a linear or bar shape that extends in the first direction D1. For example, the second upper lines UM2 may extend parallel to each other in the first direction D1.

The second metal layer M2 may further include second vias VI2. The second vias VI2 may be correspondingly provided below the second upper lines UM2. For example, the second upper lines UM2 may be electrically connected through the second vias VI2 to the first upper lines UM1.

For example, the second upper line UM2 and its underlying second via VI2 of the second metal layer M2 may be formed at the same time in a single process. In more detail, a dual damascene process may be employed to simultaneously form the second upper line UM2 and its underlying second via VI2 of the second metal layer M2.

The first and second metal layers M1 and M2 may have their lines that include the same or different conductive materials. For example, the first and second metal layers M1 and M2 may have their lines that include at least one metallic material selected from aluminum, copper, tungsten, molybdenum, and/or cobalt. Although not shown, stacked metal layers (e.g., M3, M4, M5, M6, M7, etc.) may be additionally stacked on the fourth interlayer dielectric layer 140.

A power delivery network PDN may be provided on a bottom surface of the substrate 100. The power delivery network PDN may include a fifth interlayer dielectric layer 150, a sixth interlayer dielectric layer 160, and/or a seventh interlayer dielectric layer 170 that are sequentially stacked on the bottom surface of the substrate 100.

The power delivery network PDN may further include first lower lines LM1, second lower lines LM2, and/or a pad line PAD. The first lower lines LM1 may be provided in the fifth interlayer dielectric layer 150, and the second lower lines LM2 may be provided in the sixth interlayer dielectric layer 160. A first lower via LVI1 may be provided between the first and second lower lines LM1 and LM2. The pad line PAD may be provided on the seventh interlayer dielectric layer 170. A second lower via LVI2 may be provided between the pad line PAD and the second lower lines LM2. The first lower via LVI1 may be provided on an upper portion of the sixth interlayer dielectric layer 160, and the second lower via LVI2 may be provided on an upper portion of the seventh interlayer dielectric layer 170.

The power delivery network PDN may constitute a wiring network for applying voltages to the first and/or second power lines POR1 and POR2. An external connection member CTM may be provided on a bottom surface of the pad line PAD. The external connection member CTM may include a solder, a bump, a pillar, or a combination thereof. For example, the external connection member CTM may be a solder ball including a solder material.

Through vias TVI may be provided to extend from the power delivery network PDN toward the first metal layer M1. The through via TVI may have a pillar shape that extends in a vertical direction, or a third direction D3. The through via TVI may have a bottom surface connected to the first lower line LM1. The through via TVI may have a top surface connected to one of the first and second power lines POR1 and POR2 of the first metal layer M1. Although not shown, a via (or a contact) may be interposed between the through via TVI and the first lower line LM1.

The first lower lines LM1 of the power delivery network PDN may be electrically connected by means of the through vias TVI to the first and/or second power lines POR1 and POR2 of the first metal layer M1. The pad line PAD may be electrically connected to the through via TVI through the first and/or second lower lines LM1 and LM2. In such a configuration, voltages may be applied from the power delivery network PDN through the through vias TVI to the first and/or second power lines POR1 and POR2 of the first metal layer M1. For example, a power voltage may be applied to the first power line POR1 from the external connection member CTM through the power delivery network PDN and the through via TVI.

The through vias TVI may be disposed between the first active regions PR adjacent to each other in the first direction D1 and/or between the second active regions NR adjacent to each other in the first direction D1. The through via TVI may sequentially penetrate the substrate 100, the device isolation layer ST that fills the second trench TR2, and/or the first, second, and/or third interlayer dielectric layers 110, 120, and 130.

The through via TVI may have a width that decreases as approaching the first metal layer M1 from the power delivery network PDN. The through via TVI may have a first width W1 at its lower portion greater than a second width W2 at its upper portion. For example, the first width W1 may be about 1.2 to about 2 times the second width W2. As used herein, the term about means plus or minus 10% of a value. The through via TVI may have an inclined sidewall. For example, an angle of about 85° to about 89.5° may be made between the sidewall of the through via TVI and the bottom surface of the substrate 100.

The through via TVI may include a conductive pattern FM and/or a barrier pattern BM that surrounds the conductive pattern FM. The conductive pattern FM may include at least one metal selected from aluminum, copper, tungsten, molybdenum, and/or cobalt. The barrier pattern BM may include at least one metal nitride layer selected from a titanium nitride (TiN) layer, a tantalum nitride (TaN) layer, a tungsten nitride (WN) layer, a nickel nitride (NiN) layer, a cobalt nitride (CoN) layer, and/or a platinum nitride (PtN) layer.

According to some example embodiments of the present inventive concepts, power delivery lines may be omitted from the stacked metal layers (e.g., M2, M3, M4, M5, M6, M7, etc.), and instead the power delivery network PDN may be disposed on the bottom surface of the substrate 100. Accordingly, a semiconductor device may increase in integration, and the stacked metal layers (e.g., M2, M3, M4, M5, M6, M7, etc.) may increase in the degree of routing freedom.

Figure 2A:
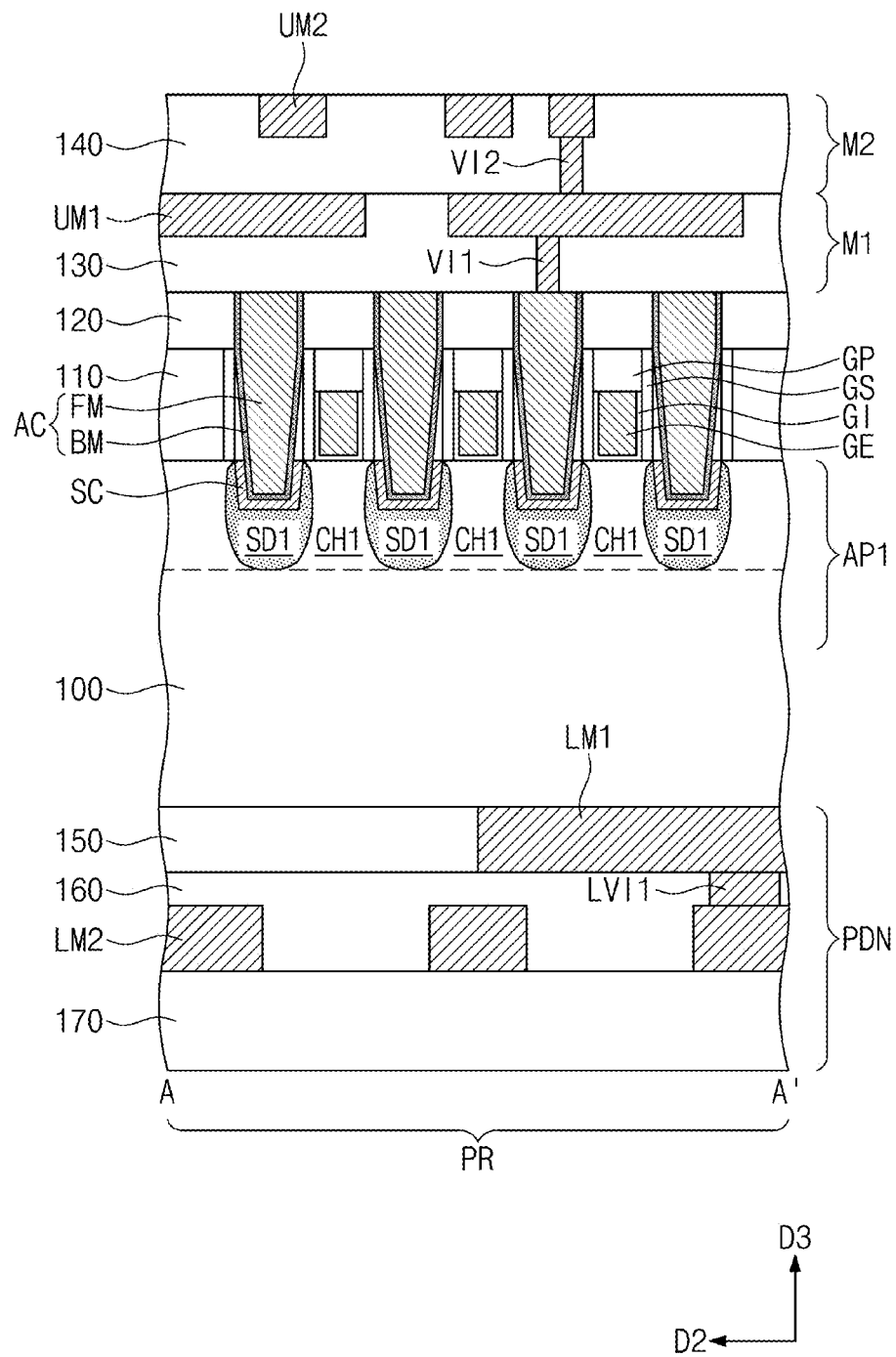
FIGS. 2A, 2B, 2C, 2D, and 2E illustrate cross-sectional views respectively taken along lines A-A', B-B', C-C', D-D', and E-E' of FIG. 1.
Figure 2B:
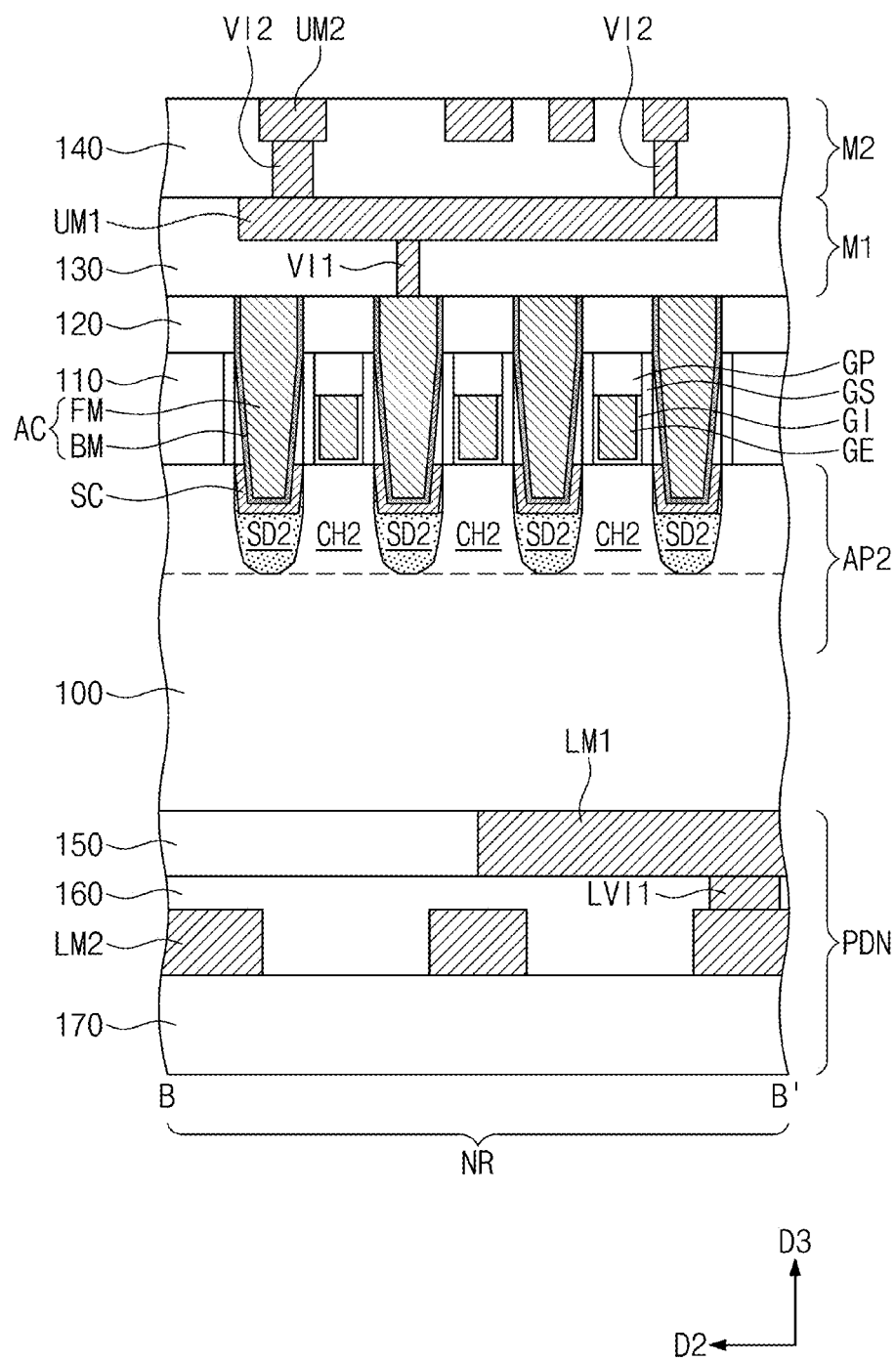
Figure 2C:
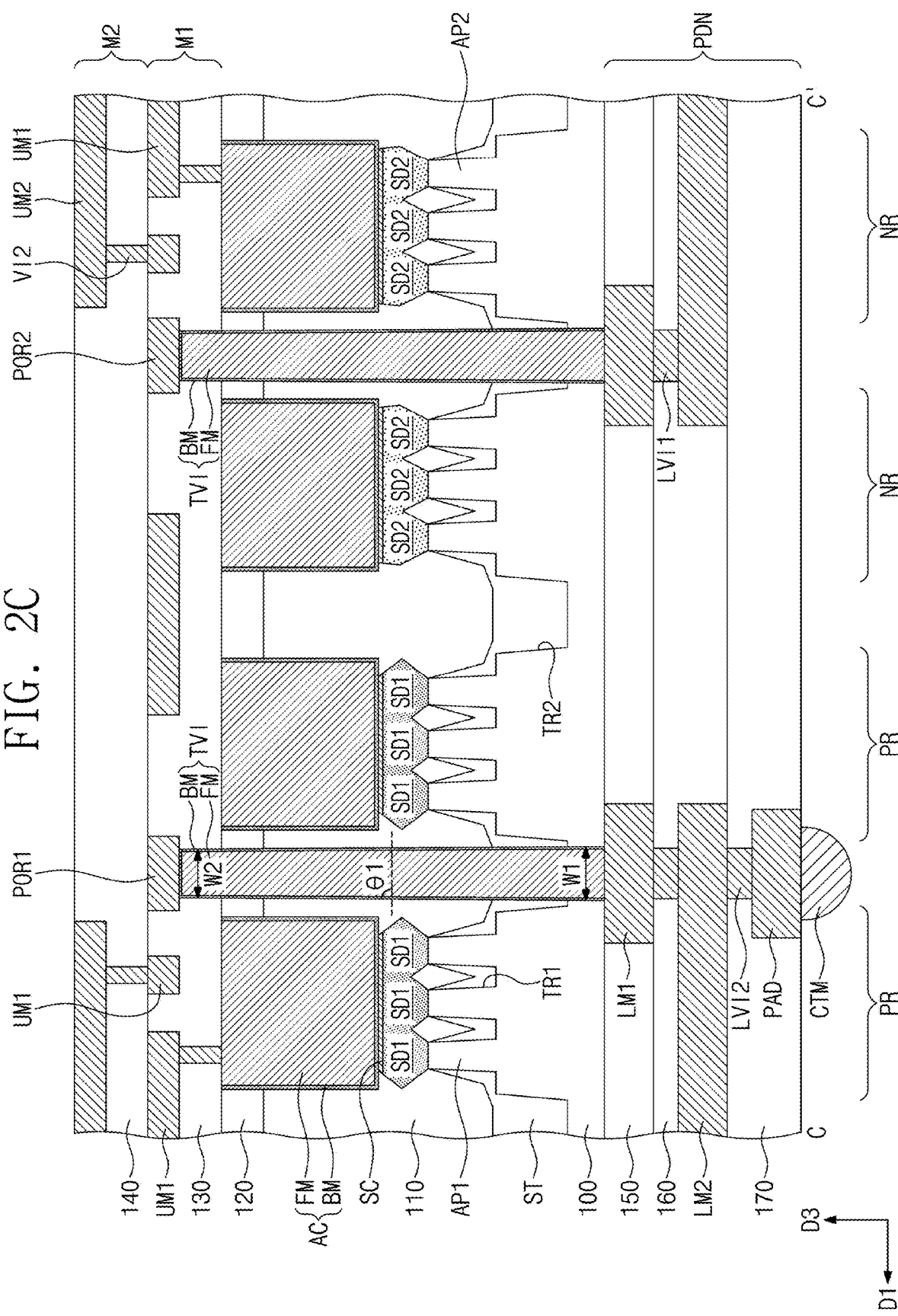
Figure 2D:
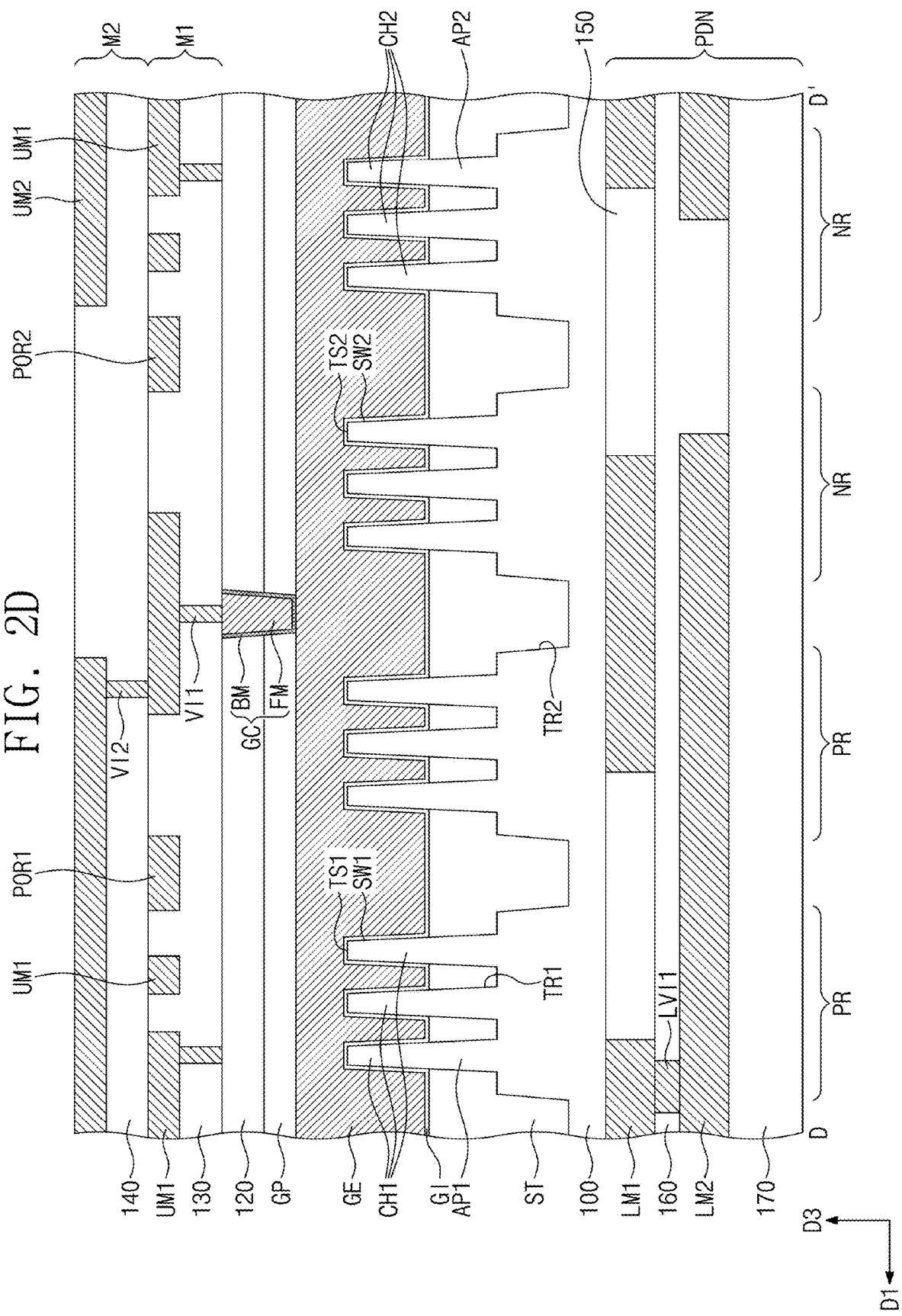
Figure 2E:
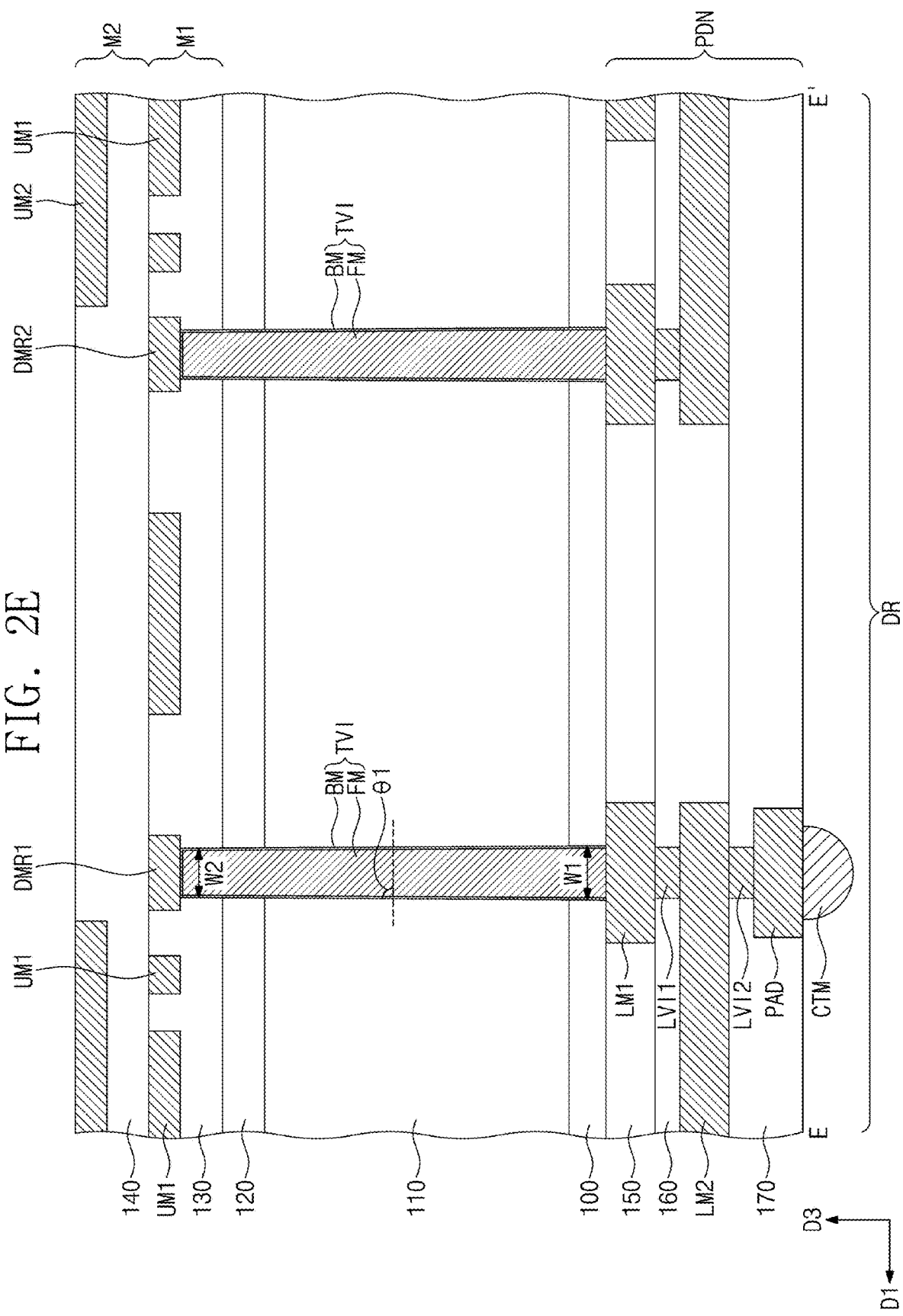

The following will describe in detail the dummy region DR with reference to FIGS. 1 and 2E. The substrate 100 may be sequentially provided thereon with first, second, third, and/or fourth interlayer dielectric layers 110, 120, 130, and 140. Unlike the cell region CR, the dummy region DR may include none of components such as the active regions PR and/or NR, the active patterns AP1 and/or AP2, the device isolation layer ST, the source/drain patterns SD1 and/or SD2, the gate electrodes GE, the active contacts AC, and/or the gate contact GC. For example, the dummy region DR may include no transistor, and may be an area to perform a buffer function.

A first metal layer M1 may be provided in the third interlayer dielectric layer 130. On the dummy region DR, the first metal layer M1 may include first upper lines UM1, a first dummy line DMR1, and/or a second dummy line DMR2.

The first upper lines UM1, the first dummy line DMR1, and/or the second dummy line DMR2 may each extend in the second direction D2, while running across the dummy region DR. For example, the first dummy line DMR1 may be supplied with a ground voltage, and the second dummy line DMR2 may be electrically floated.

A second metal layer M2 may be provided in the fourth interlayer dielectric layer 140. The second metal layer M2 may include second upper lines UM2. The second upper lines UM2 of the second metal layer M2 may each have a linear or bar shape that extends in the first direction D1. For example, the second upper lines UM2 may extend parallel to each other in the first direction D1.

The first and second metal layers M1 and M2 may have their lines that include the same or different conductive materials. Although not shown, stacked metal layers (e.g., M3, M4, M5, M6, M7, etc.) may be additionally stacked on the fourth interlayer dielectric layer 140.

A power delivery network PDN may be provided on the bottom surface of the substrate 100. The power delivery network PDN may include a fifth interlayer dielectric layer 150, a sixth interlayer dielectric layer 160, and/or a seventh interlayer dielectric layer 170 that are sequentially stacked on the bottom surface of the substrate 100.

The power delivery network PDN may further include first lower lines LM1, second lower lines LM2, and/or a pad line PAD. The first lower lines LM1 may be provided in the fifth interlayer dielectric layer 150, and the second lower lines LM2 may be provided in the sixth interlayer dielectric layer 160. A first lower via LVI1 may be provided between the first and second lower lines LM1 and LM2. The pad line PAD may be provided on the seventh interlayer dielectric layer 170. A second lower via LVI2 may be provided between the pad line PAD and the second lower lines LM2. The first lower via LVI1 may be provided on an upper portion of the sixth interlayer dielectric layer 160, and the second lower via LVI2 may be provided on an upper portion of the seventh interlayer dielectric layer 170.

The power delivery network PDN may constitute a wiring network for applying voltages to the first and/or second dummy lines DMR1 and DMR2. An external connection member CTM may be provided on a bottom surface of the pad line PAD. The external connection member CTM may include a solder, a bump, a pillar, or a combination thereof. For example, the external connection member CTM may be a solder ball including a solder material.

Through vias TVI may be provided to extend from the power delivery network PDN toward the first metal layer M1. The through via TVI may have a pillar shape that extends in a vertical direction, or the third direction D3. The through via TVI may have a bottom surface connected to the first lower line LM1. The through via TVI may have a top surface connected to one of the first and second dummy lines DMR1 and DMR2 of the first metal layer M1. Although not shown, a via (or a contact) may be interposed between the through via TVI and the first lower line LM1.

The first lower lines LM1 of the power delivery network PDN may be electrically connected by means of the through vias TVI to the first and/or second dummy lines DMR1 and DMR2 of the first metal layer M1. The pad line PAD may be electrically connected to the through via TVI through the first and/or second lower lines LM1 and LM2. In such a configuration, voltages may be applied from the power delivery network PDN through the through vias TVI to the first and/or second dummy lines DMR1 and DMR2 of the first metal layer M1. For example, a ground voltage may be applied to the first dummy line DMR1 from the external connection member CTM through the power delivery network PDN and the through via TVI.

The through via TVI may sequentially penetrate the substrate 100, the device isolation layer ST that fills the second trench TR2, and/or the first, second, and/or third interlayer dielectric layers 110, 120, and 130. The through via TVI connected to the first dummy line DMR1 may vertically overlap the pad line PAD. The through via TVI connected to the second dummy line DMR2 may be horizontally offset from the pad line PAD. The through via TVI connected to the second dummy line DMR2 may be electrically floated. The ground voltage may be applied through the pad line PAD to the first dummy line DMR1, and thus it may be possible to reduce sensitivity to voltage change on the cell region CR. As a result, a semiconductor device may increase in electrical characteristics.

The through via TVI may have a width that decreases as approaching the first metal layer M1 from the power delivery network PDN. The through via TVI may have a first width W1 at its lower portion greater than a second width W2 at its upper portion. For example, the first width W1 may be about 1.2 to about 2 times the second width W2. The through via TVI may have an inclined sidewall. For example, an angle of about 85° to about 89.5° may be made between the sidewall of the through via TVI and the bottom surface of the substrate 100.

According to some example embodiments of the present inventive concepts, as the through via TVI is provided on the dummy region DR, a difference in density may be reduced between the cell region CR and the dummy region DR. Therefore, uniformity of a semiconductor device may be increased in fabrication processes. In addition, as the pad line PAD is provided, the ground voltage may be applied by means of the through via TVI to the first dummy line DMR1. As a result, a semiconductor device may improve in electrical characteristics.

Figure 3:
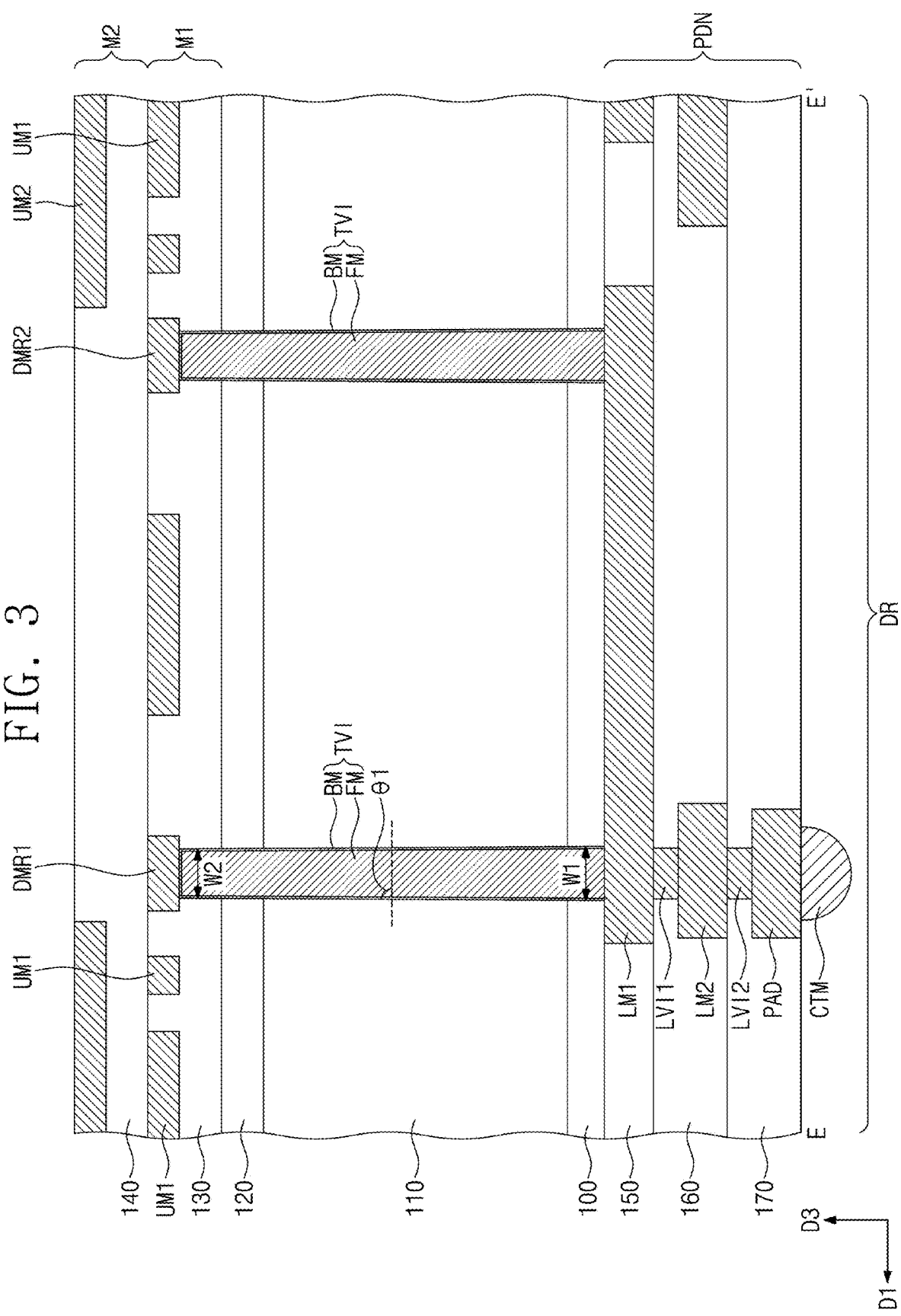
FIGS. 3 and 4 illustrate cross-sectional views taken along line E-E' of FIG. 1, showing a semiconductor device according to some example embodiments of the present inventive concepts.
Figure 4:
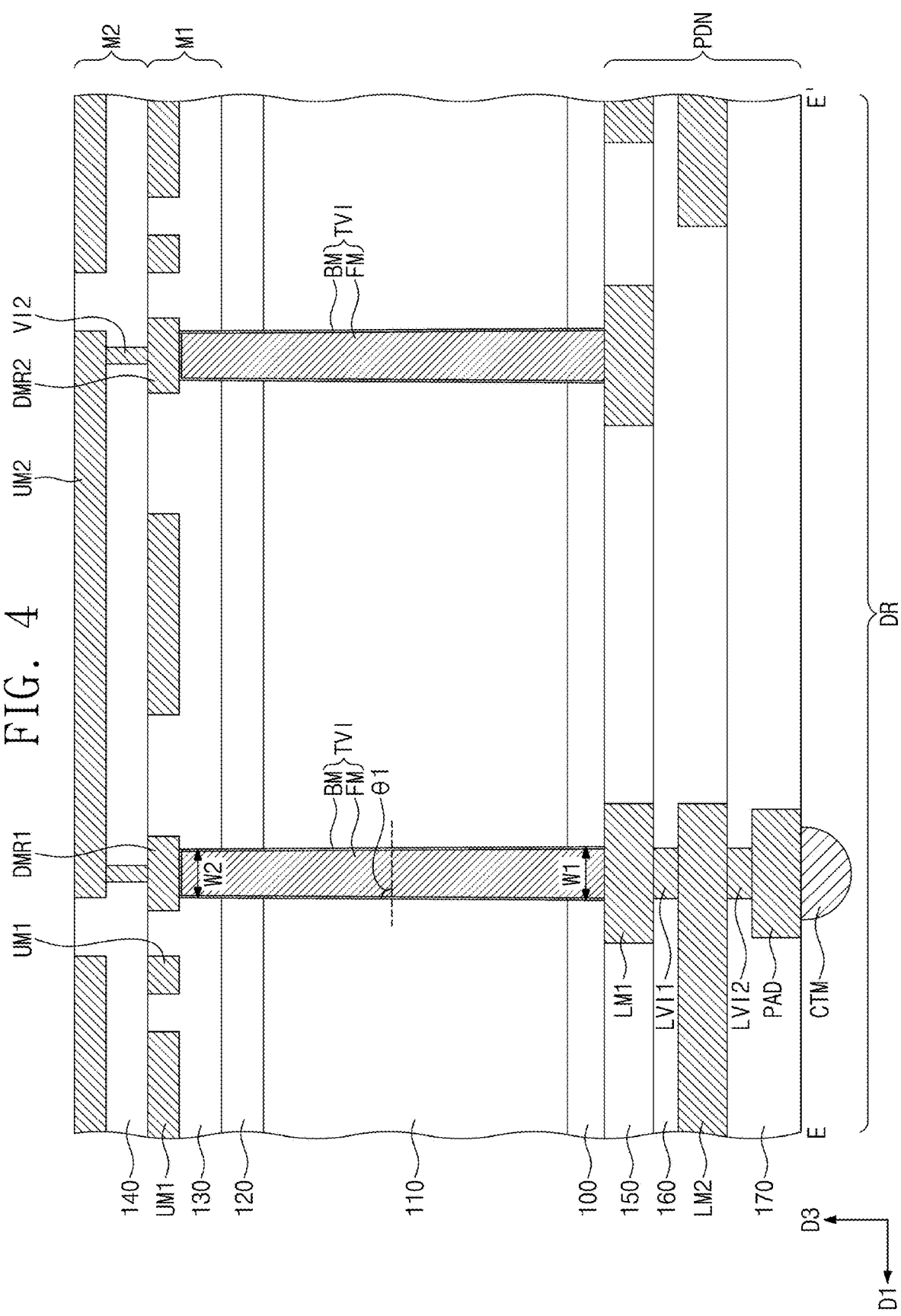

FIGS. 3 and 4 illustrate cross-sectional views taken along line E-E' of FIG. 1, showing a semiconductor device according to some example embodiments of the present inventive concepts. In the embodiments that follow, repetitive descriptions of those discussed above will be omitted, and differences thereof will be explained in detail.

Referring to FIGS. 1 and 3, an electrical connection may be provided between the through vias TVI that are spaced apart from each other in the first direction D1 and are respectively coupled to the first dummy line DMR1 and the second dummy line DMR2. The first lower line LM1 may extend in the first direction D1. The through via TVI coupled to the first dummy line DMR1 may be electrically connected through the first lower line LM1 to the through via TVI coupled to the second dummy line DMR2. The through via TVI connected to the second dummy line DMR2 may not vertically overlap the pad line PAD.

Referring to FIGS. 1 and 4, the second metal layer M2 may include second vias VI2. One of the second vias VI2 may be interposed between and electrically connect the second upper line UM2 and the first dummy line DMR1, and another of the second vias VI2 may be interposed between and electrically connect the second upper line UM2 and the second dummy line DMR2. An electrical connection may be provided between the through vias TVI that are spaced apart from each other in the first direction D1 and are respectively coupled to the first dummy line DMR1 and the second dummy line DMR2. For example, the through via TVI coupled to the first dummy line DMR1 may be electrically connected through the second metal layer M2 to the through via TVI coupled to the second dummy line DMR2. The through via TVI connected to the second dummy line DMR2 may not vertically overlap the pad line PAD.

Figure 5:
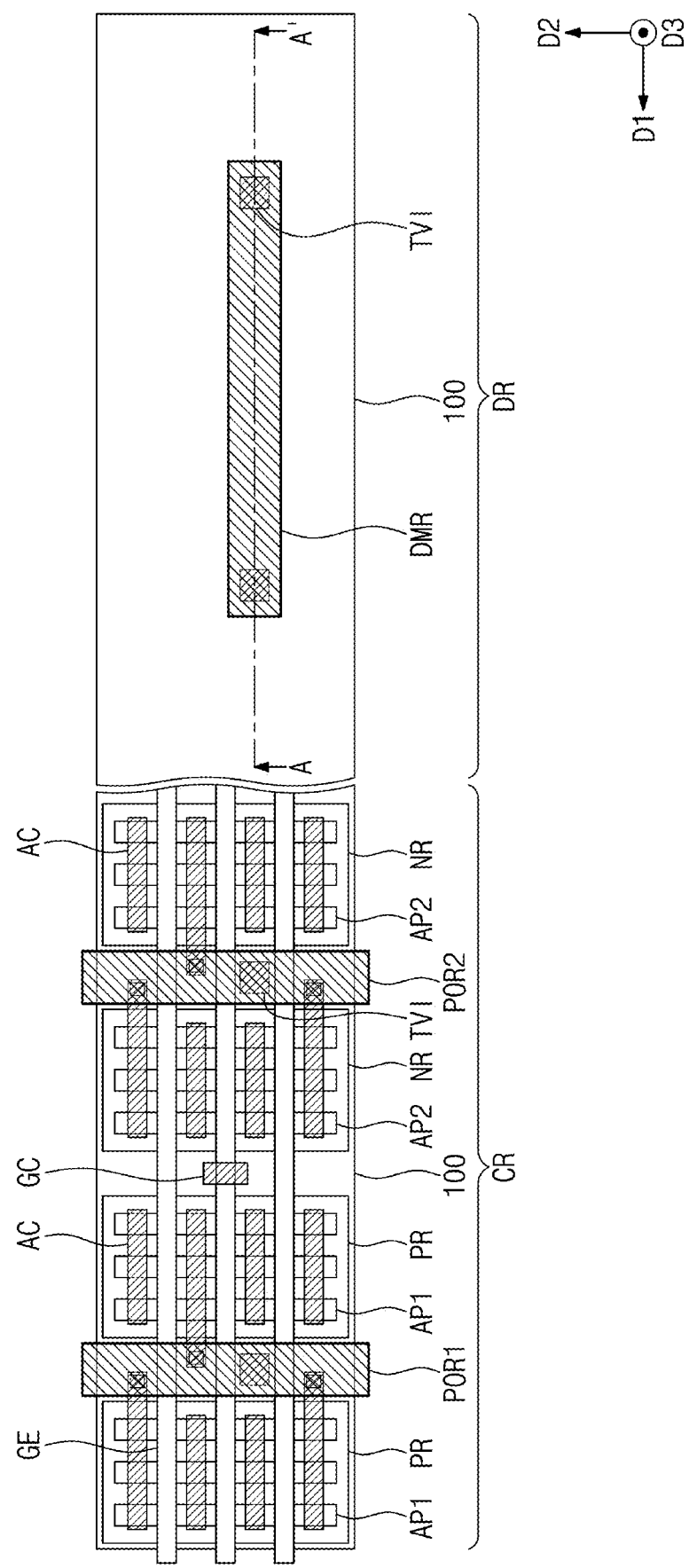
FIG. 5 illustrates a plan view showing a semiconductor device according to some example embodiments of the present inventive concepts.
Figure 6:
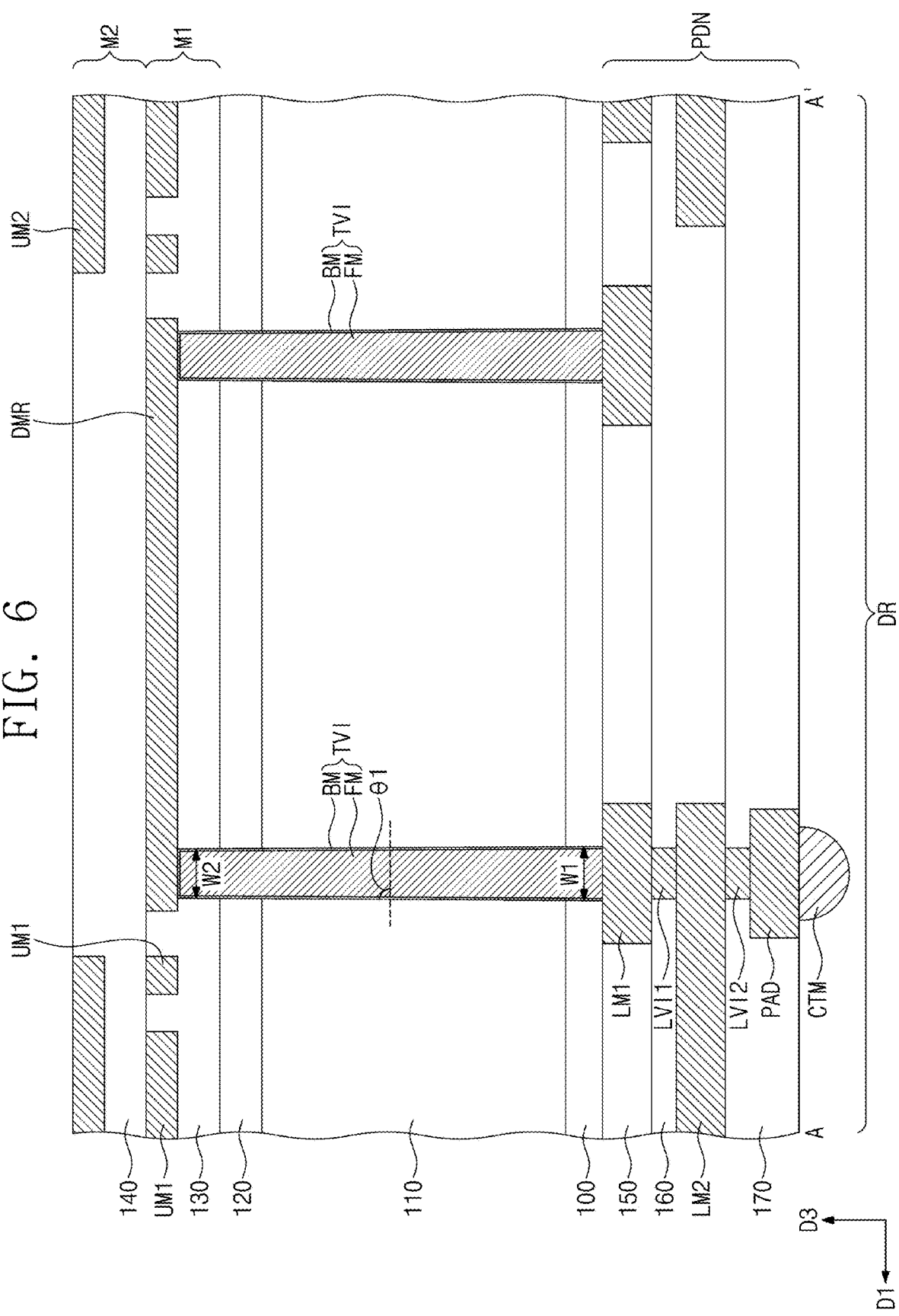
FIG. 6 illustrates a cross-sectional view taken along line A-A' of FIG. 5.

FIG. 5 illustrates a plan view showing a semiconductor device according to some example embodiments of the present inventive concepts. FIG. 6 illustrates a cross-sectional view taken along line A-A' of FIG. 5. In the embodiment that follows, repetitive descriptions of those discussed above will be omitted, and differences thereof will be explained in detail.

Referring to FIGS. 5 and 6, the first metal layer M1 may include a first upper line UM1 and/or a dummy line DMR. For example, the first upper line UM1 and the dummy line DMR may extend parallel to each other in the first direction D1. The second upper lines UM2 of the second metal layer M2 may extend parallel to each other in the second direction D2.

The through vias TVI may be adjacent to each other in the first direction D1 and are electrically connected to the dummy line DMR. For example, the dummy line DMR may electrically connect to each of the through vias TVI that are adjacent to each other in the first direction D1.

Figure 7:
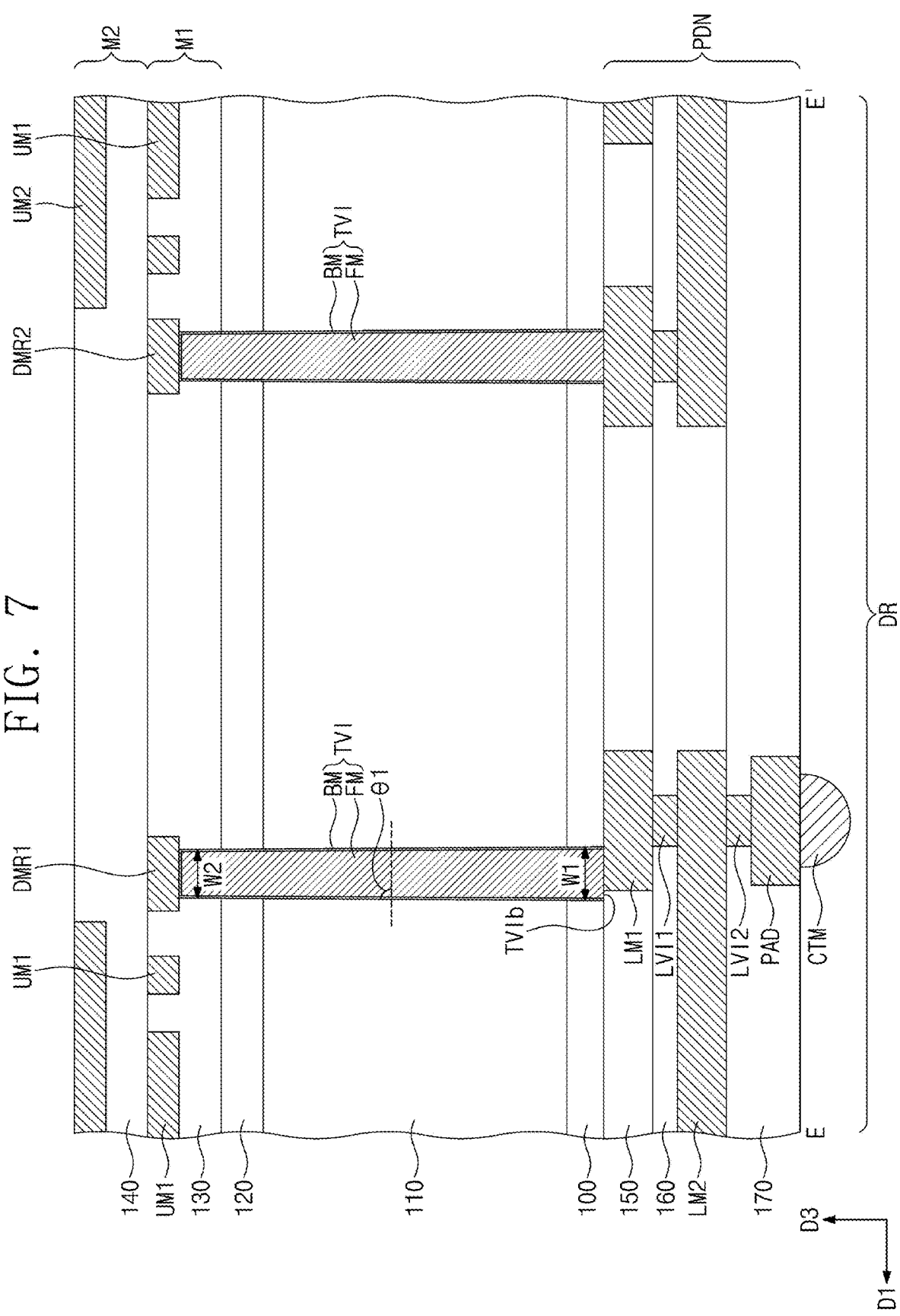
FIG. 7 illustrates a cross-sectional view taken along line E-E' of FIG. 1, showing a semiconductor device according to some example embodiments of the present inventive concepts.

FIG. 7 illustrates a cross-sectional view taken along line E-E' of FIG. 1, showing a semiconductor device according to some example embodiments of the present inventive concepts. In the description of the example embodiment that follows, repetitive descriptions of those discussed above will be omitted, and differences thereof will be explained in detail.

Referring to FIGS. 1 and 7, the through via TVI connected to the first dummy line DMR1 may have a portion that is horizontally offset from the first lower line LM1. For example, the through via TVI connected to the first dummy line DMR1 may have a bottom surface TVIb in contact with the fifth interlayer dielectric layer 150. The portion of the through via TVI connected to the first dummy line DMR1 may not vertically overlap the first lower line LM1.

Figure 8:
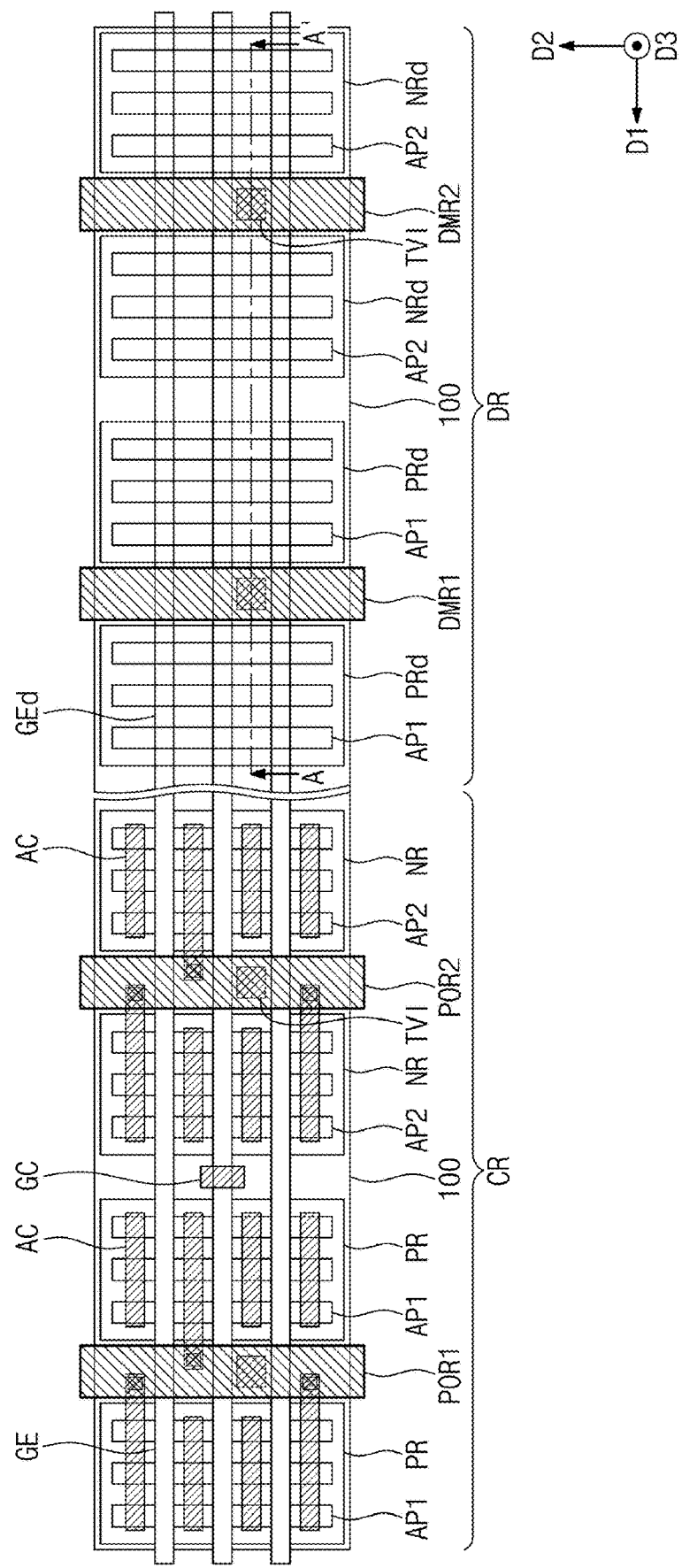
FIG. 8 illustrates a plan view showing a semiconductor device according to some example embodiments of the present inventive concepts.
Figure 9:
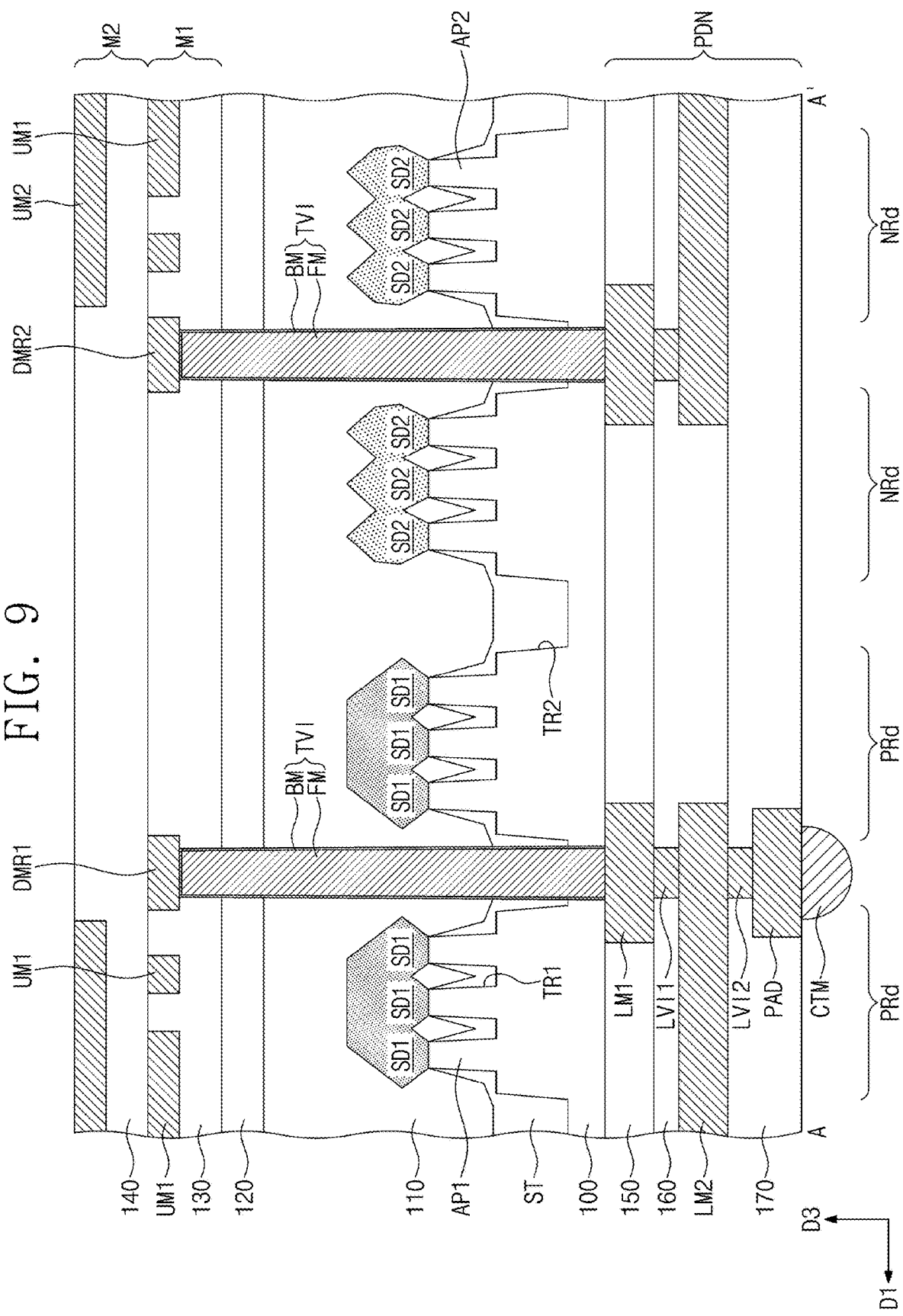
FIG. 9 illustrates a cross-sectional view taken along line A-A' of FIG. 8.

FIG. 8 illustrates a plan view showing a semiconductor device according to some example embodiments of the present inventive concepts. FIG. 9 illustrates a cross-sectional view taken along line A-A' of FIG. 8. In the embodiment that follows, repetitive descriptions of those discussed above will be omitted, and differences thereof will be explained in detail.

Referring to FIGS. 8 and 9, the dummy region DR may include at least one first dummy active region PRd and/or at least one second dummy active region NRd. The first dummy active region PRd may have the same structure on the substrate 100 as that of the first active region PR discussed above, but may not constitute a logic circuit. The second dummy active region NRd may have the same structure on the substrate 100 as that of the second active region NR discussed above, but may not constitute a logic circuit.

Dummy electrodes GEd may be provided on the first and/or second dummy active regions PRd and NRd. The dummy electrodes GEd may be arranged along the second direction D2. The dummy electrodes GEd may be arranged at a pitch substantially the same as the first pitch between the gate electrodes GE discussed above. The dummy electrode GEd may have the same structure as that of the gate electrode GE discussed above, but may not constitute a logic circuit.

Neither the active contact AC nor the gate contact GC may be provided on the first and second dummy active regions PRd and NRd. For example, the dummy region DR may have substantially the same structure as that of the cell region CR discussed with reference to FIGS. 1 and 2A to 2D, but may not include components such as the gate electrode GE, the active contact AC, and/or the gate contact GC.

The first dummy line DMR1 may be disposed between neighboring first dummy active regions PRd. The second dummy line DMR2 may be disposed between neighboring second dummy active regions NRd.

The first metal layer M1 may be provided in the third interlayer dielectric layer 130. On the dummy region DR, the first metal layer M1 may include first upper lines UM1, a first dummy line DMR1, and/or a second dummy line DMR2.

For example, the first upper lines UM1, the first dummy line DMR1, and the second dummy line DMR2 may each extend in the second direction D2, while running across the dummy region DR. The first dummy line DMR1 may be supplied with a ground voltage, and the second dummy line DMR2 may be electrically floated.

A second metal layer M2 may be provided in the fourth interlayer dielectric layer 140. The second metal layer M2 may include second upper lines UM2. For example, the second upper lines UM2 of the second metal layer M2 may each have a linear or bar shape that extends in the first direction D1. In this case, the second upper lines UM2 may extend parallel to each other in the first direction D1.

A power delivery network PDN may be provided on the bottom surface of the substrate 100. The power delivery network PDN may include a fifth interlayer dielectric layer 150, a sixth interlayer dielectric layer 160, and/or a seventh interlayer dielectric layer 170 that are sequentially stacked on the bottom surface of the substrate 100.

Through vias TVI may be provided to extend from the power delivery network PDN toward the first metal layer M1. The through via TVI may have a pillar shape that extends in a vertical direction, or the third direction D3. The through via TVI may have a bottom surface connected to the first lower line LM1. The through via TVI may have a top surface connected to one of the first and second dummy lines DMR1 and DMR2 of the first metal layer M1. Although not shown, a via (or a contact) may be interposed between the through via TVI and the first lower line LM1. The through vias TVI may be disposed between neighboring first dummy active regions PRd and between neighboring second dummy active regions NRd.

The first lower lines LM1 of the power delivery network PDN may be electrically connected by means of the through vias TVI to the first and/or second dummy lines DMR1 and DMR2 of the first metal layer M1. The pad line PAD may be electrically connected to the through via TVI through the first and/or second lower lines LM1 and LM2. In such a configuration, voltages may be applied from the power delivery network PDN through the through vias TVI to the first and/or second dummy lines DMR1 and DMR2 of the first metal layer M1. For example, a ground voltage may be applied to the first dummy line DMR1 from the external connection member CTM through the power delivery network PDN and the through via TVI.

The through via TVI may sequentially penetrate the substrate 100, the device isolation layer ST that fills the second trench TR2, and/or the first, second, and/or third interlayer dielectric layers 110, 120, and 130. The through via TVI connected to the first dummy line DMR1 may vertically overlap the pad line PAD. The through via TVI connected to the second dummy line DMR2 may be horizontally offset from the pad line PAD. The through via TVI connected to the second dummy line DMR2 may be electrically floated.

As illustrated in FIG. 9, on the dummy region DR, the power delivery network PDN, the through via TVI, and/or the first and/or second metal layers M1 and M2 may each have substantially the same structure as that discussed with reference to FIG. 2E. Although not shown, on the dummy region DR, the power delivery network PDN, the through via TVI, and/or the first and/or second metal layers M1 and M2 may each have substantially the same structure as that discussed with reference to FIG. 3, 4, 6, or 7.

FIGS. 10A to 10D illustrate cross-sectional views taken along line C-C' of FIG. 1, showing a method of fabricating a semiconductor device according to some example embodiments of the present inventive concepts. In the embodiment that follows, repetitive descriptions of those discussed above will be omitted, and differences thereof will be explained in detail.

Figure 10A:
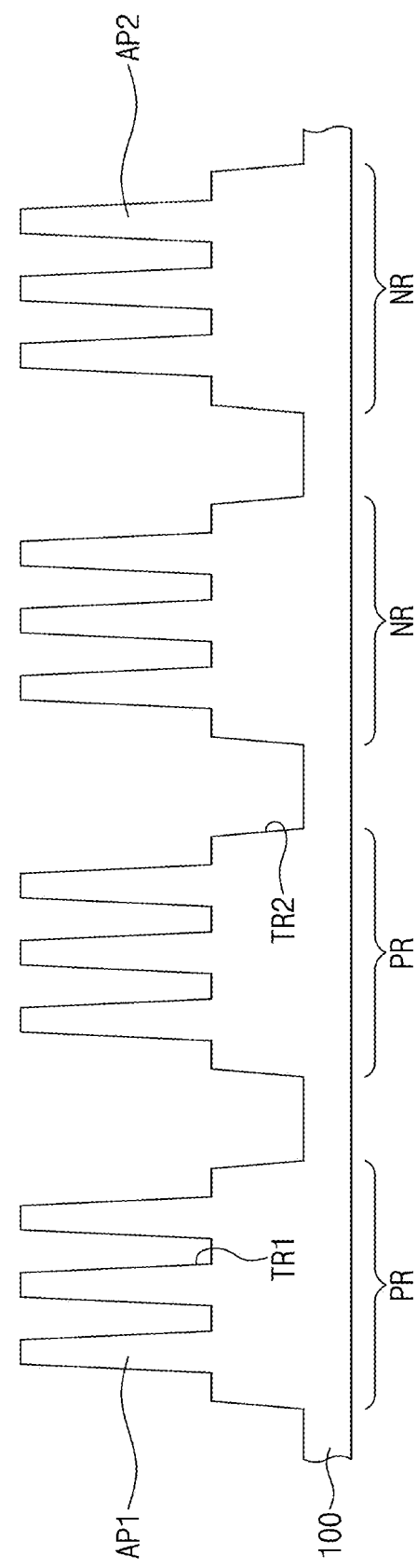
FIGS. 10A to 10D illustrate cross-sectional views taken along line C-C' of FIG. 1, showing a method of fabricating a semiconductor device according to some example embodiments of the present inventive concepts.

Referring to FIG. 10A, a substrate 100 may be provided which includes a first active region PR and/or a second active region NR. The substrate 100 may be patterned to form first and/or second active patterns AP1 and AP2. The first active patterns AP1 may be formed on the first active region PR, and the second active patterns AP2 may be formed on the second active region NR. A first trench TR1 may be formed between neighboring first active patterns AP1 and/or between neighboring second active patterns AP2. The substrate 100 may be patterned to form a second trench TR2 between the first active region PR and the second active region NR. The second trench TR2 may be formed deeper than the first trench TR1.

Figure 10B:
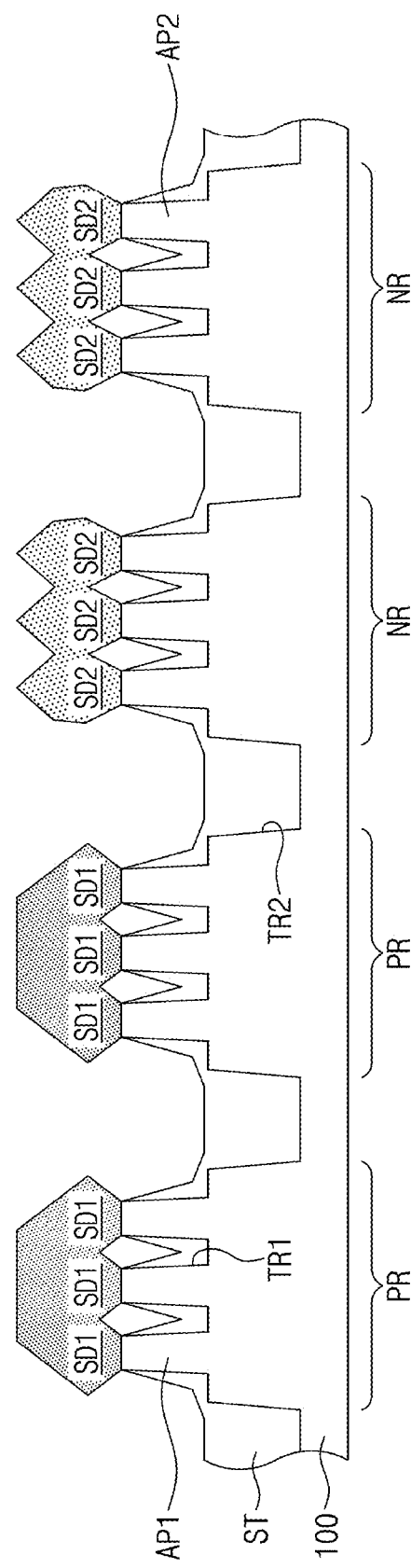

Referring to FIG. 10B, a device isolation layer ST may be formed on the substrate 100, filling the first and/or second trenches TR1 and TR2. The device isolation layer ST may include a dielectric material, such as a silicon oxide layer. The device isolation layer ST may be recessed until upper portions of the first and/or second active patterns AP1 and AP2 are exposed. Therefore, the first and/or second active patterns AP1 and AP2 may have their upper portions that vertically protrude beyond the device isolation layer ST.

First source/drain patterns SD1 may be formed on the upper portions of the first active patterns AP1. For example, the upper portions of the first active patterns AP1 may be etched to form first recesses. While the upper portions of the first active patterns AP1 are etched, the device isolation layer ST may be recessed between the first active patterns AP1.

The first source/drain pattern SD1 may be formed by performing a selective epitaxial growth process in which an inner wall of the first recess of the first active pattern AP1 is used as a seed layer. For example, the selective epitaxial growth process may include a chemical vapor deposition (CVD) process and/or a molecular beam epitaxy (MBE) process. The first source/drain patterns SD1 may include a semiconductor element (e.g., SiGe) whose lattice constant is greater than that of a semiconductor element of the substrate 100. Each, or at least one, of the first source/drain patterns SD1 may be formed of a plurality of semiconductor layers.

For example, impurities may be in-situ implanted during the selective epitaxial growth process for the formation of the first source/drain patterns SD1. For another example, after the formation of the first source/drain patterns SD1, impurities may be implanted into the first source/drain patterns SD1. The first source/drain patterns SD1 may be doped to have a first conductivity type (e.g., p-type).

Second source/drain patterns SD2 may be formed on the upper portions of the second active patterns AP2. For example, the upper portions of the second active patterns AP2 may be etched to form second recesses. The second source/drain pattern SD2 may be formed by performing a selective epitaxial growth process in which an inner wall of the second recess of the second active pattern AP2 is used as a seed layer. For example, the second source/drain patterns SD2 may include the same semiconductor element (e.g., Si) as that of the substrate 100. The second source/drain patterns SD2 may be doped to have a second conductivity type (e.g., n-type).

Different processes may be performed to sequentially form the first source/drain patterns SD1 and the second source/drain patterns SD2. For example, the first and second source/drain patterns SD1 and SD2 may not be formed at the same time.

Referring to FIGS. 1, 2A, and 2B, a first interlayer dielectric layer 110 may be formed to cover the first and/or second source/drain patterns SD1 and SD2. For example, the first interlayer dielectric layer 110 may include a silicon oxide layer.

Gate electrodes GE may be formed to extend in a first direction D1, while running across the first and/or second active patterns AP1 and AP2. Gate dielectric patterns GI may be formed below the gate electrodes GE. Gate spacers GS may be formed on opposite sides of each, or at least one, of the gate electrodes GE. Gate capping patterns GP may be formed on corresponding gate electrodes GE.

Figure 10C:
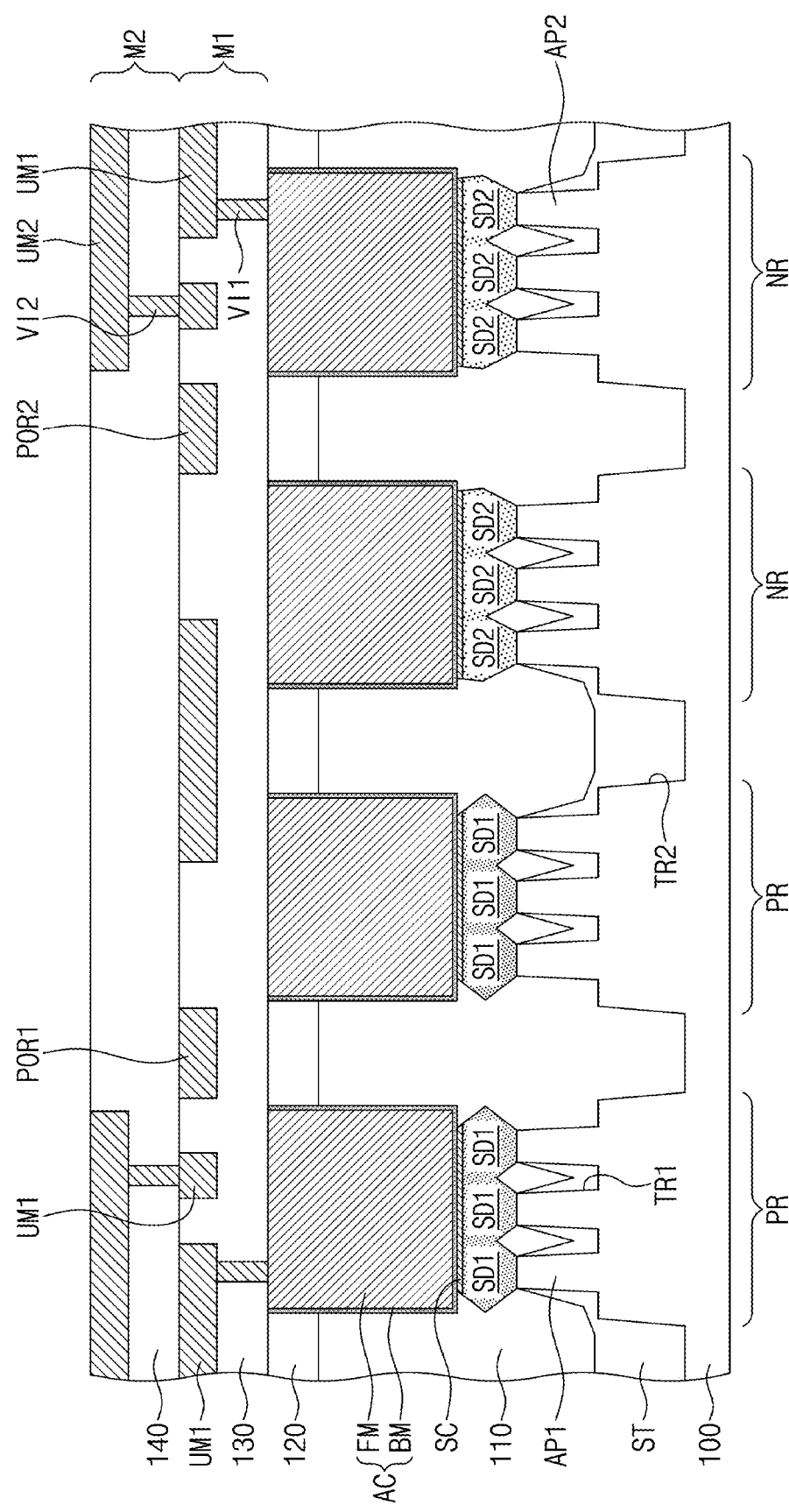

Referring to FIG. 10C, a second interlayer dielectric layer 120 may be formed on the first interlayer dielectric layer 110. Active contacts AC may be formed to penetrate the first and/or second interlayer dielectric layers 110 and 120. The active contacts AC may be formed on the first and/or second source/drain patterns SD1 and SD2.

A third interlayer dielectric layer 130 and/or a fourth interlayer dielectric layer 140 may be formed on the second interlayer dielectric layer 120. A first metal layer M1 may be formed in the third interlayer dielectric layer 130, and/or a second metal layer M2 may be formed in the fourth interlayer dielectric layer 140. First upper lines UM1, a first power line POR1, and/or a second power line POR2 may be formed in the third interlayer dielectric layer 130. Second upper lines UM2 may be formed in the fourth interlayer dielectric layer 140.

Figure 10D:
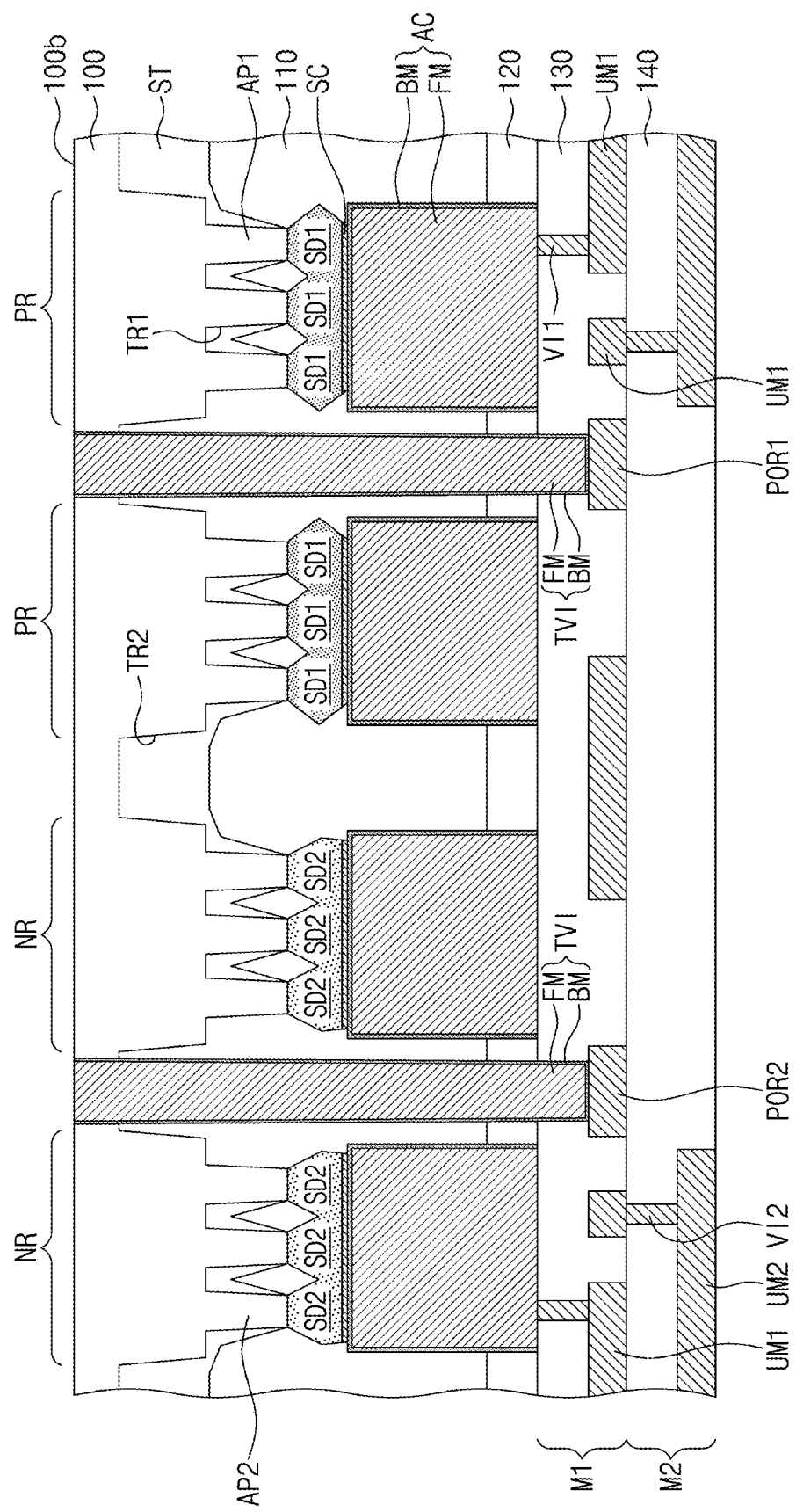

Referring to FIG. 10D, the substrate 100 may be flipped to expose a bottom surface 100b of the substrate 100. For example, the substrate 100 may be flipped to allow its bottom surface 100b to face upwardly.

The substrate 100 may undergo a wet etching process to etch the substrate 100. For example, the etching process may be performed in which the substrate 100, the device isolation layer ST, and/or the first, second, and/or third interlayer dielectric layers 110, 120, and 130 are sequentially etched to form through holes.

Through vias TVI may be formed to extend toward the first metal layer M1 from the bottom surface 100b of the substrate 100. For example, the formation of the through vias TVI may include allowing the bottom surface 100b of the substrate 100 to undergo an etching process to form through holes that expose the first and/or second power lines POR1 and POR2, and then forming the through vias TVI in corresponding through holes.

Referring back to FIG. 2C, fifth, sixth, and/or seventh interlayer dielectric layers 150, 160, and 170 may be formed on the bottom surface 100b of the substrate 100. First lower lines LM1 may be formed in the fifth interlayer dielectric layer 150, and/or second lower lines LM2 may be formed in the sixth interlayer dielectric layer 160. A pad line PAD may be formed in the seventh interlayer dielectric layer 170. The first and/or second lower lines LM1 and LM2 and/or the pad line PAD may constitute a power delivery network PDN. The power delivery network PDN may provide the first and/or second power lines POR1 and POR2 with power and/or ground voltages by means of the through vias TVI.

An external connection member CTM may be formed on a bottom surface of the pad line PAD.

FIGS. 11A, 11B, 11C, and 11D illustrate cross-sectional views respectively taken along lines A-A', B-B', C-C', and D-D' of FIG. 1, showing a semiconductor device according to some example embodiments of the present inventive concepts. In the embodiments that follow, repetitive descriptions of those discussed above will be omitted, and differences thereof will be explained in detail.

Referring to FIGS. 1 and 11A to 11D, a first active region PR and a second active region NR may be provided on a substrate 100. A device isolation layer ST may be provided on the substrate 100. The device isolation layer ST may define a first active pattern AP1 and/or a second active pattern AP2 on an upper portion of the substrate 100. The first active pattern AP1 and the second active pattern AP2 may be respectively provided on the first active region PR and the second active region NR.

The first active pattern AP1 may include first channel patterns CH1 that are vertically stacked. The stacked first channel patterns CH1 may be spaced apart from each other in a third direction D3. The stacked first channel patterns CH1 may vertically overlap each other. The second active pattern AP2 may include second channel patterns CH2 that are vertically stacked. The stacked second channel patterns CH2 may vertically overlap each other. The first and second channel patterns CH1 and/or CH2 may include at least one selected from silicon (Si), germanium (Ge), and/or silicon-germanium (SiGe).

The first active pattern AP1 may further include first source/drain patterns SD1. The stacked first channel patterns CH1 may be interposed between a pair of neighboring first source/drain patterns SD1. The stacked first channel patterns CH1 may connect the pair of neighboring first source/drain patterns SD1 to each other.

The second active pattern AP2 may further include second source/drain patterns SD2. The stacked second channel patterns CH2 may be interposed between a pair of neighboring second source/drain patterns SD2. The stacked second channel patterns CH2 may connect the pair of neighboring second source/drain patterns SD2 to each other.

Gate electrodes GE may be provided to extend in a first direction D1, while running across the first and/or second channel patterns CH1 and CH2. The gate electrode GE may vertically overlap the first and/or second channel patterns CH1 and CH2. A pair of gate spacers GS may be disposed on opposite sidewalls of the gate electrode GE. A gate capping pattern GP may be provided on the gate electrode GE.

Figure 11A:
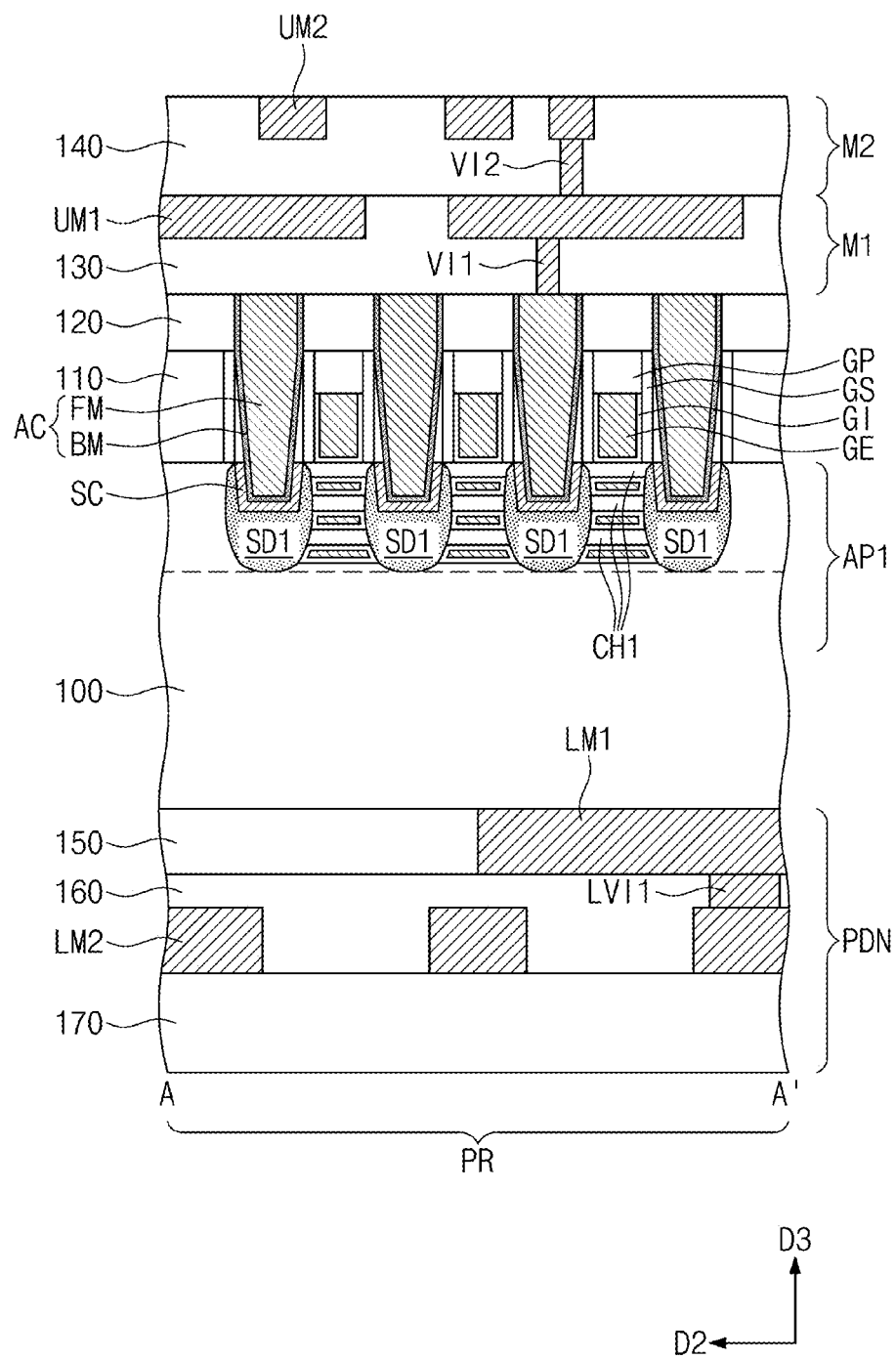
FIGS. 11A, 11B, 11C, and 11D illustrate cross-sectional views respectively taken along lines A-A', B-B', C-C', and D-D' of FIG. 1, showing a semiconductor device according to some example embodiments of the present inventive concepts.
Figure 11B:
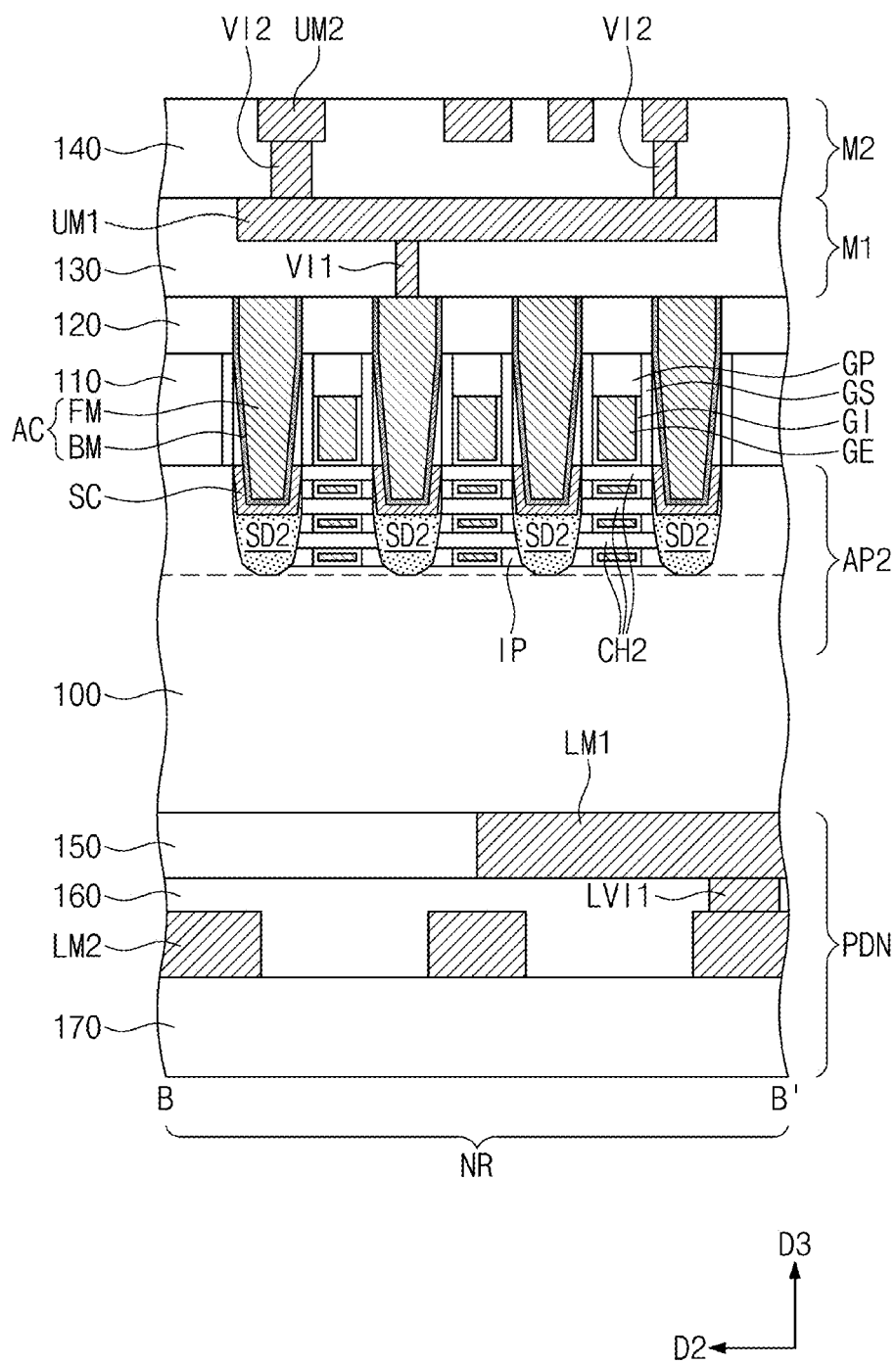
Figure 11C:
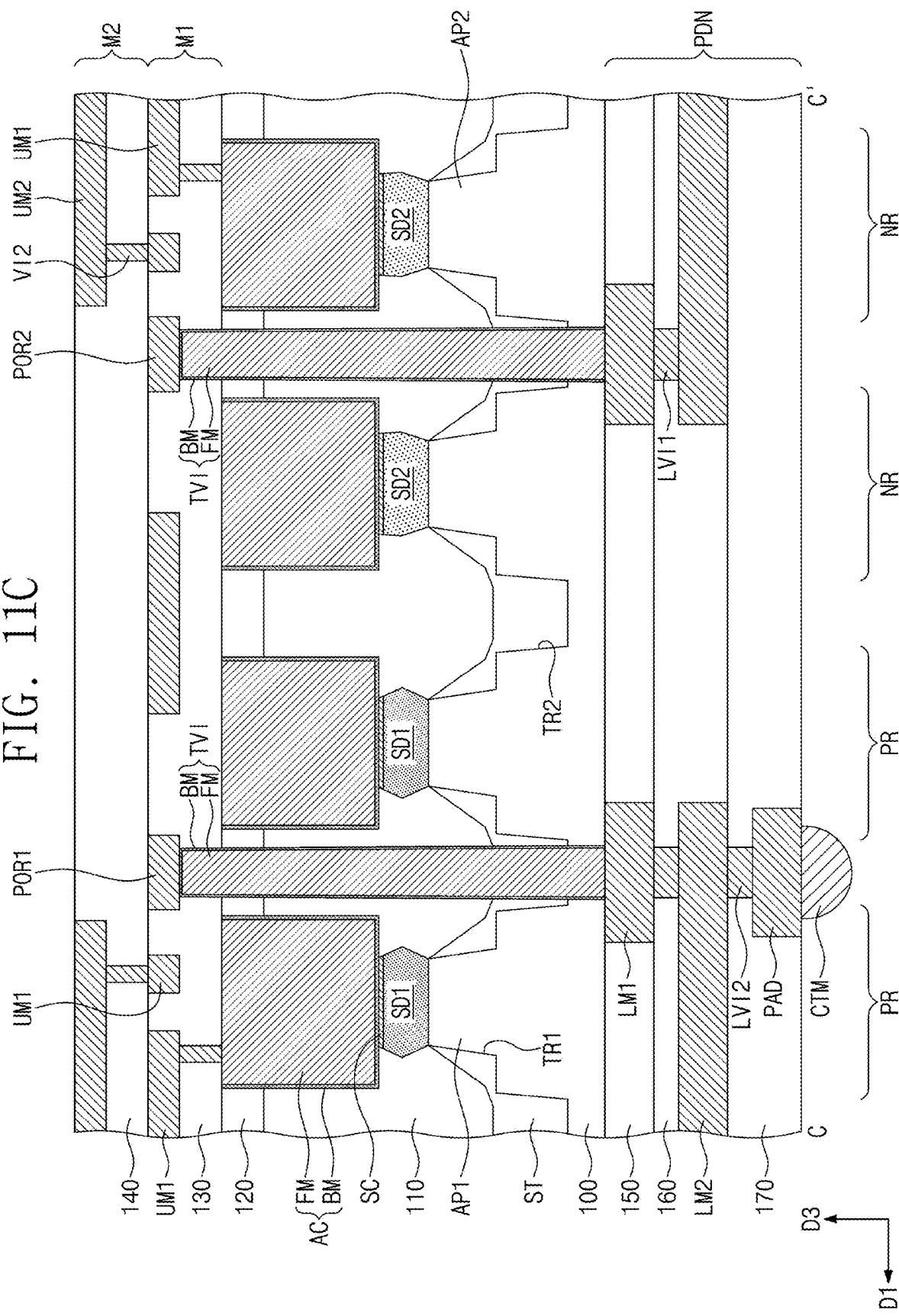
Figure 11D:
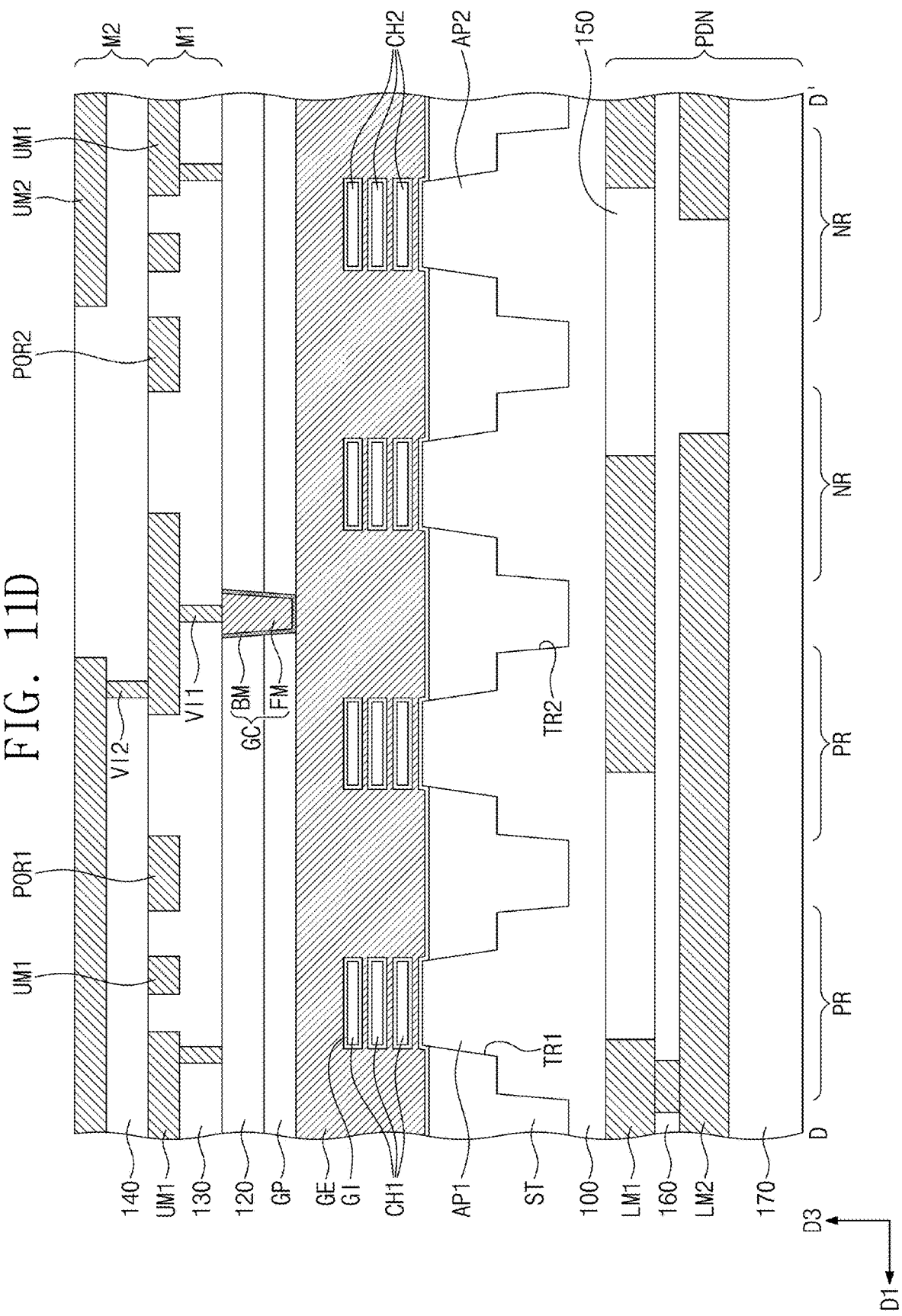

The gate electrode GE may surround each, or at least one, of the first and/or second channel patterns CH1 and CH2 (see FIG. 11D). The gate electrode GE may surround top and/or bottom surfaces and/or opposite sidewalls of each of the first and/or second channel patterns CH1 and CH2. A transistor according to the present embodiment may be a three-dimensional field effect transistor (e.g. MBCFET) in which the gate electrode GE three-dimensionally surrounds the first and/or second channel patterns CH1 and CH2.

A gate dielectric pattern GI may be provided between the gate electrode GE and each, or at least one, of the first and/or second channel patterns CH1 and CH2. The gate dielectric pattern GI may surround each, or at least one, of the first and/or second channel patterns CH1 and CH2.

On the second active region NR, a dielectric pattern IP may be interposed between the gate dielectric pattern GI and the second source/drain pattern SD2. The gate dielectric pattern GI and the dielectric pattern IP may separate the gate electrode GE from the second source/drain pattern SD2. In contrast, the dielectric pattern IP may be omitted from the first active region PR.

Active contacts AC may be provided to penetrate first and/or second interlayer dielectric layers 110 and 120 on the substrate 100 and to have connections with the first and/or second source/drain patterns SD1 and SD2. A gate contact GC may be provided to penetrate the second interlayer dielectric layer 120 and/or the gate capping pattern GP and to have a connection with the gate electrode GE. A first metal layer M1 may be provided in a third interlayer dielectric layer 130. A second metal layer M2 may be provided in a fourth interlayer dielectric layer 140.

A power delivery network PDN may be provided on a bottom surface of the substrate 100. The power delivery network PDN may include a fifth interlayer dielectric layer 150, a sixth interlayer dielectric layer 160, and/or a seventh interlayer dielectric layer 170 that are sequentially stacked on the bottom surface of the substrate 100. First lower lines LM1 may be provided in the fifth interlayer dielectric layer 150. Second lower lines LM2 may be provided in the sixth interlayer dielectric layer 160. A pad line PAD may be provided in the seventh interlayer dielectric layer 170. An external connection member CTM may be provided on a bottom surface of the pad line PAD.

Through vias TVI may be formed to extend from the power delivery network PDN toward the first metal layer M1. The through vias TVI may be provided between neighboring first active regions PR and between neighboring second active regions NR.

The first metal layer M1, the second metal layer M2, the power delivery network PDN, and/or the through via TVI may be substantially the same as those discussed with reference to FIGS. 1 and 2A to 2D.

Figure 12:
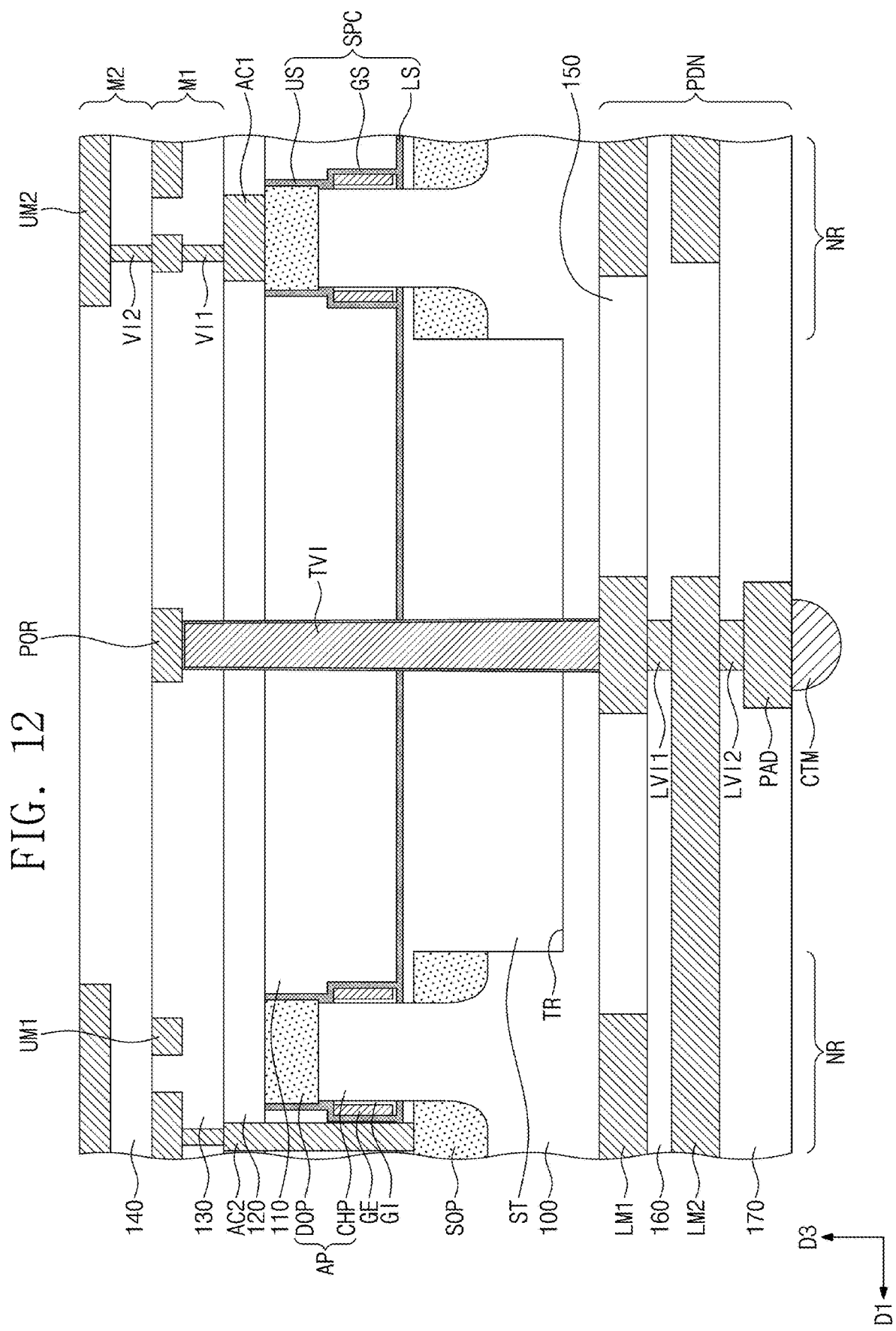
FIG. 12 illustrates a cross-sectional view showing a semiconductor device according to some example embodiments of the present inventive concepts.

FIG. 12 illustrates a cross-sectional view showing a semiconductor device according to some example embodiments of the present inventive concepts. In the embodiment that follows, repetitive descriptions of those discussed above will be omitted, and differences thereof will be explained in detail.

Referring to FIG. 12, a semiconductor device according to the present embodiment may include vertical transistors (e.g., vertical FETs) and lines that connect the vertical transistors to each other.

For example, a substrate 100 may include a first active region (not shown) and a second active region NR. Active regions may be defined by a trench TR formed on an upper portion of the substrate 100. A lower epitaxial pattern SOP may be provided on the second active region NR. The lower epitaxial pattern SOP may be an epitaxial pattern formed by a selective epitaxial growth process. The lower epitaxial pattern SOP may be provided on an upper portion of the substrate 100.

An active pattern AP may be provided on the second active region NR. The active pattern AP may have a fin shape that vertically protrudes. When viewed in plan, the active pattern AP may have a bar shape that extends in a first direction D1. The active pattern AP may include a channel pattern CHP that vertically protrudes from the lower epitaxial pattern SOP and/or an upper epitaxial pattern DOP on the channel pattern CHP.

A device isolation layer ST may be provided on the substrate 100, thereby filling the trench TR. The device isolation layer ST may cover a top surface of the lower epitaxial pattern SOP. The active pattern AP may vertically protrude beyond the device isolation layer ST.

A gate electrode GE may be provided on the device isolation layer ST. The gate electrode GE may surround the channel pattern CHP of the active pattern AP. A gate dielectric pattern GI may be interposed between the gate electrode GE and the channel pattern CHP. The gate dielectric pattern GI may cover a bottom surface of the gate electrode GE and/or an inner wall of the gate electrode GE. For example, the gate dielectric pattern GI may directly cover a sidewall of the active pattern AP.

The upper epitaxial pattern DOP may vertically protrude beyond the gate electrode GE. The gate electrode GE may have a top surface lower than a bottom surface of the upper epitaxial pattern DOP. For example, the active pattern AP may have a structure that vertically protrudes from the substrate 100 and penetrates the gate electrode GE.

The semiconductor device according to the present embodiment may include vertical transistors in which carriers move in a third direction D3. For example, when the transistor is turned on due to a voltage applied to the gate electrode GE, the carriers may migrate from the lower epitaxial pattern SOP through the channel pattern CHP toward the upper epitaxial pattern DOP. The gate electrode GE according to the present embodiment may completely surround a sidewall of the channel pattern CHP. The transistor according to the present embodiment may be a three-dimensional field effect transistor (e.g., VFET) having a gate-all-around structure. As the gate electrode GE completely surrounds the channel pattern CHP, the semiconductor device according to the present inventive concepts may have excellent electrical characteristics.

The device isolation layer ST may be provided thereon with a spacer SPC that covers the gate electrode GE and the active pattern AP. The spacer SPC may include a silicon nitride layer and/or a silicon oxynitride layer. The spacer SPC may include a lower spacer LS, an upper spacer US, and/or a gate spacer GS between the lower and upper spacers LS and US.

The lower spacer LS may directly cover a top surface of the device isolation layer ST. The lower spacer LS may cause that the gate electrode GE is separated in the third direction D3 from the device isolation layer ST. The gate spacer GS may cover a top surface and/or an outer wall of the gate electrode GE. The upper spacer US may cover the upper epitaxial pattern DOP. However, the upper spacer US may not cover but expose a top surface of the upper epitaxial pattern DOP.

A first interlayer dielectric layer 110 may be provided on the spacer SPC. The first interlayer dielectric layer 110 may have a top surface substantially coplanar with that of the upper epitaxial pattern DOP. Second, third, and/or fourth interlayer dielectric layers 120, 130, and 140 may be sequentially stacked on the first interlayer dielectric layer 110. The second interlayer dielectric layer 120 may cover the top surface of the upper epitaxial pattern DOP.

At least one first active contact AC1 may be provided which penetrates the second interlayer dielectric layer 120 and is coupled to the upper epitaxial pattern DOP. At least one second active contact AC2 may be provided which sequentially penetrates the second interlayer dielectric layer 120, the first interlayer dielectric layer 110, the lower spacer LS, and/or the device isolation layer ST and is coupled to the lower epitaxial pattern SOP. A gate contact (not shown) may be provided which sequentially penetrates the second interlayer dielectric layer 120, the first interlayer dielectric layer 110, and/or the gate spacer GS and is coupled to the gate electrode GE. The first and/or second active contacts AC1 and AC2 and/or the gate contact may have their top surfaces substantially coplanar with that of the second interlayer dielectric layer 120. A first metal layer M1 may be provided in the third interlayer dielectric layer 130. A second metal layer M2 may be provided in the fourth interlayer dielectric layer 140.

A power delivery network PDN may be provided on a bottom surface of the substrate 100. The power delivery network PDN may be electrically connected by means of a through via TVI to a power line POR of the first metal layer M1.

The first metal layer M1, the second metal layer M2, the power delivery network PDN, and/or the through via TVI may be substantially the same as those discussed with reference to FIGS. 1 and 2A to 2D.

A semiconductor device according to some example embodiments of the present inventive concepts may include a negative capacitance field effect transistor that uses a negative capacitor. For example, a gate dielectric pattern may include a ferroelectric material layer having ferroelectric properties and/or a paraelectric material layer having paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value and may be increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a subthreshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and/or lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and/or oxide (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). A kind of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and/or yttrium (Y).

When the impurities are aluminum (Al), the ferroelectric material layer may include about 3 to about 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and/or high-k metal oxide. The metal oxide included in the paraelectric material layer may include, for example, at least one selected from hafnium oxide, zirconium oxide, and/or aluminum oxide, but the present inventive concepts are not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a different crystal structure from that of the hafnium oxide included in the paraelectric material layer.

The ferroelectric material layer may have a thickness having ferroelectric properties. The thickness of the ferroelectric material layer may range, for example, from about 0.5 nm to about 10 nm. Because ferroelectric materials have their own critical thicknesses exhibiting ferroelectric properties, the thickness of the ferroelectric material layer may depend on ferroelectric material.

For example, a gate dielectric pattern may include a single ferroelectric material layer. For another example, the gate dielectric pattern may include a plurality of ferroelectric material layers that are spaced apart from each other. The gate dielectric pattern may have a structure in which a plurality of ferroelectric material layers are stacked alternately with a plurality of paraelectric material layers.

A semiconductor device according the present inventive concepts may include a power delivery network disposed on a bottom surface of a substrate, and thus may have increased integration and improved degree of routing freedom in stacked metal layers. In addition, the power delivery network may include a pad line. Therefore, a ground voltage may be applied to a through via provided on a dummy region, and it may thus be possible to reduce sensitivity to voltage change on a cell region. As a result, the semiconductor device may increase in electrical characteristics.

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor device, comprising:
    a substrate that includes a cell region and a dummy region;
    a first metal layer on the substrate, the first metal layer including a dummy line on the dummy region;
    a power delivery network on a bottom surface of the substrate; and
    a first through via that penetrates the substrate and extends from the power delivery network toward the dummy line,
    wherein the first through via is electrically connected to the dummy line,
    wherein the power delivery network includes:
        a plurality of lower lines; and
        a pad line below the lower lines, and
    wherein the pad line is electrically connected through the lower lines to the first through via.

2. The semiconductor device of claim 1, further comprising an external connection member on the pad line,
    wherein the external connection member is configured to apply a ground voltage to the dummy line through the first through via.

3. The semiconductor device of claim 1, wherein the power delivery network further includes an interlayer dielectric layer below the substrate,
    wherein the lower lines and the pad line are in the interlayer dielectric layer, and
    wherein at least a portion of a bottom surface of the first through via is in contact with the interlayer dielectric layer.

4. The semiconductor device of claim 1, further comprising a second through via spaced apart in a first direction from the first through via, the second through via penetrating the substrate and extending from the power delivery network toward the first metal layer.

5. The semiconductor device of claim 4, wherein the second through via is configured to be electrically floated.

6. The semiconductor device of claim 4, wherein the first and second through vias are electrically connected to each other through the dummy line.

7. The semiconductor device of claim 4, wherein the lower lines include:
    a first lower line below the substrate; and
    a second lower line below the first lower line,
    wherein the first and second through vias are electrically connected to each other through the first lower line.

8. The semiconductor device of claim 4, further comprising a second metal layer on the first metal layer,
    wherein the first and second through vias are electrically connected to each other through the second metal layer.

9. The semiconductor device of claim 1, wherein the dummy region includes:
    a first dummy active region and a second dummy active region spaced apart from each other; and
    a device isolation layer that fills a trench between the first and second dummy active regions,
    wherein the first through via penetrates the device isolation layer.

10. The semiconductor device of claim 1, wherein the first metal layer further includes a power line on the cell region,
    wherein the cell region includes:
        a first active region and a second active region that are spaced apart from each other; and
        a second through via between the first and second active regions, and
    wherein the second through via penetrates the substrate and electrically connects the power delivery network to the power line.

11. A semiconductor device, comprising:
    a substrate;
    a first metal layer on the substrate;
    a power delivery network on a bottom surface of the substrate; and a first through via and a second through via that penetrate the substrate and extend from the power delivery network toward the first metal layer, wherein the power delivery network includes:
- a first lower line electrically connected to the first through via;
- a second lower line electrically connected to the second through via; and
- a pad line electrically connected to the first lower line, and wherein the second through via and the second lower line are configured to be electrically floated.

12. The semiconductor device of claim 11, wherein the power delivery network further includes an interlayer dielectric layer below the substrate, wherein the first and second lower lines and the pad line are in the interlayer dielectric layer, and wherein at least a portion of a bottom surface of the first through via is in contact with the interlayer dielectric layer.

13. The semiconductor device of claim 11, wherein the substrate includes a cell region and a dummy region, wherein the first metal layer includes:
- a power line on the cell region; and
- a dummy line on the dummy region, and wherein the first and second through vias are on the dummy region.

14. The semiconductor device of claim 13, wherein the dummy region includes:
- a first dummy active region and a second dummy active region spaced apart from each other; and
- a device isolation layer that fills a trench between the first and second dummy active regions, wherein the first through via penetrates the device isolation layer.

15. The semiconductor device of claim 13, further comprising an external connection member on the pad line, wherein the external connection member is configured to apply a ground voltage to the dummy line through the first through via.

16. A semiconductor device, comprising:
- a substrate that includes a cell region and a dummy region;
- a first metal layer on the substrate;
- a second metal layer on the first metal layer; and
- a power delivery network on a bottom surface of the substrate, wherein the cell region includes:
- a first active region and a second active region;
- a first active pattern and a second active pattern on the first active region and the second active region, respectively;
- a first source/drain pattern and a second source/drain pattern on upper portions of the first active pattern and the second active pattern, respectively;
- a gate electrode extending in a first direction and running across the first and second active patterns;
- an active contact adjacent to one side of the gate electrode and coupled to one of the first and second source/drain patterns;
- a gate contact coupled to the gate electrode; and
- a first through via that penetrates the substrate and extends from the power delivery network toward a power line of the first metal layer, wherein the dummy region includes a second through via that penetrates the substrate and extends from the power delivery network toward a dummy line of the first metal layer, and wherein the power delivery network includes:
- a first lower line electrically connected to the first through via;
- a second lower line electrically connected to the second through via;
- a pad line electrically connected to the second lower line; and
- an external connection member on the pad line.

17. The semiconductor device of claim 16, wherein the pad line vertically overlaps the second through via, and the external connection member is configured to apply a ground voltage to the dummy line through the second through via.

18. The semiconductor device of claim 16, wherein the dummy region includes:
- a first dummy active region and a second dummy active region spaced apart from each other; and
- a device isolation layer that fills a trench between the first and second dummy active regions, wherein the second through via penetrates the device isolation layer.

19. The semiconductor device of claim 16, wherein the power delivery network further includes an interlayer dielectric layer below the substrate, wherein the first and second lower lines and the pad line are in the interlayer dielectric layer, and wherein at least a portion of a bottom surface of the second through via is in contact with the interlayer dielectric layer.

20. The semiconductor device of claim 16, wherein the dummy region further includes a third through via spaced apart in the first direction from the second through via and extends from the power delivery network toward the first metal layer, wherein the third through via is configured to be electrically floated.

* * * * *